(12) United States Patent
Maeda et al.

(10) Patent No.: US 7,105,389 B2
(45) Date of Patent: Sep. 12, 2006

(54) METHOD OF MANUFACTURING SEMICONDUCTOR DEVICE HAVING IMPURITY REGION UNDER ISOLATION REGION

(75) Inventors: Shigenobu Maeda, Tokyo (JP); Toshiaki Iwamatsu, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/748,273

(22) Filed: Dec. 31, 2003

(65) Prior Publication Data

US 2004/0150047 A1 Aug. 5, 2004

Related U.S. Application Data

(62) Division of application No. 09/988,593, filed on Nov. 20, 2001.

(30) Foreign Application Priority Data

Jan. 9, 2001 (JP) .................................... P2001-001418

(51) Int. Cl.
*H01L 21/00* (2006.01)

(52) U.S. Cl. ...................... 438/149; 438/151; 438/154; 438/155; 438/233; 438/296; 438/298; 438/405; 438/433; 438/453

(58) Field of Classification Search ................ 438/149, 438/151, 154, 155, 233, 296, 298, 405, 433, 438/453
See application file for complete search history.

(56) References Cited

U.S. PATENT DOCUMENTS 5,767,549 A 6/1998 Chen et al.
6,410,369 B1 * 6/2002 Flaker et al. ................ 438/149
6,441,436 B1 * 8/2002 Wu et al. ..................... 257/350
6,483,165 B1 11/2002 Ooishi et al.
6,495,898 B1 * 12/2002 Iwamatsu et al. ........... 257/506
2002/0072155 A1 * 6/2002 Liu et al. ..................... 438/151
2002/0110989 A1 8/2002 Yamaguchi et al.
2005/0037524 A1 * 2/2005 Matsumoto et al. .......... 438/14

FOREIGN PATENT DOCUMENTS

DE 199 62 053 A1 7/2000

OTHER PUBLICATIONS

U.S. Appl. No. 09/466,934, filed Dec. 20, 1999, Yamaguchi et al., Allowance, Nov. 21, 2002.
U.S. Appl. No. 09/639,953, filed Aug. 17, 2000, Iwamatin et al., U.S. 6,495,898.
U.S. Appl. No. 09/677,881, filed Oct. 3, 2000, Matsumoto et al., U.S. 6,455,894.
Hirano, et al., "*Bulk–Layout–Compatible 0.18 μm SOI–COS Technology Using Body–Fixed Partial Trench Isolation (PTI)*" Proceedings of 1999 IEEE International SOI Conference, Oct. 1999, pp. 131–132.

(Continued)

*Primary Examiner*—George Fourson
*Assistant Examiner*—Thanh V. Pham
(74) *Attorney, Agent, or Firm*—McDermott Will & Emery LLP

(57) ABSTRACT

In formation of a source/drain region of an NMOS transistor, a gate-directional extension region <41a> of an N+ block region <41> in an N+ block resist film <51> prevents a well region <11> located under the gate-directional extension region <41a> from implantation of an N-type impurity. A high resistance forming region, which is the well region <11> having a possibility for implantation of an N-type impurity on a longitudinal extension of a gate electrode <9>, can be formed as a high resistance forming region <A2> narrower than a conventional high resistance forming region <A1>. Thus, a semiconductor device having a partially isolated body fixed SOI structure capable of reducing body resistance and a method of manufacturing the same are obtained.

19 Claims, 34 Drawing Sheets

OTHER PUBLICATIONS

Maeda, et al., *"Analysis of Delay Time Instability According to the Operating Frequency in Field Shield Isolated SOI Circuits"* Proceeding of IEEE Transactions of Electron Devices, vol. 45, No. 7, Jul. 1998, pp. 1479–1486.

Widmann, D., et al. "Technologie hochintegrierter Schaltungen." Springer Verlag (1996), pp. 68–71.

* cited by examiner

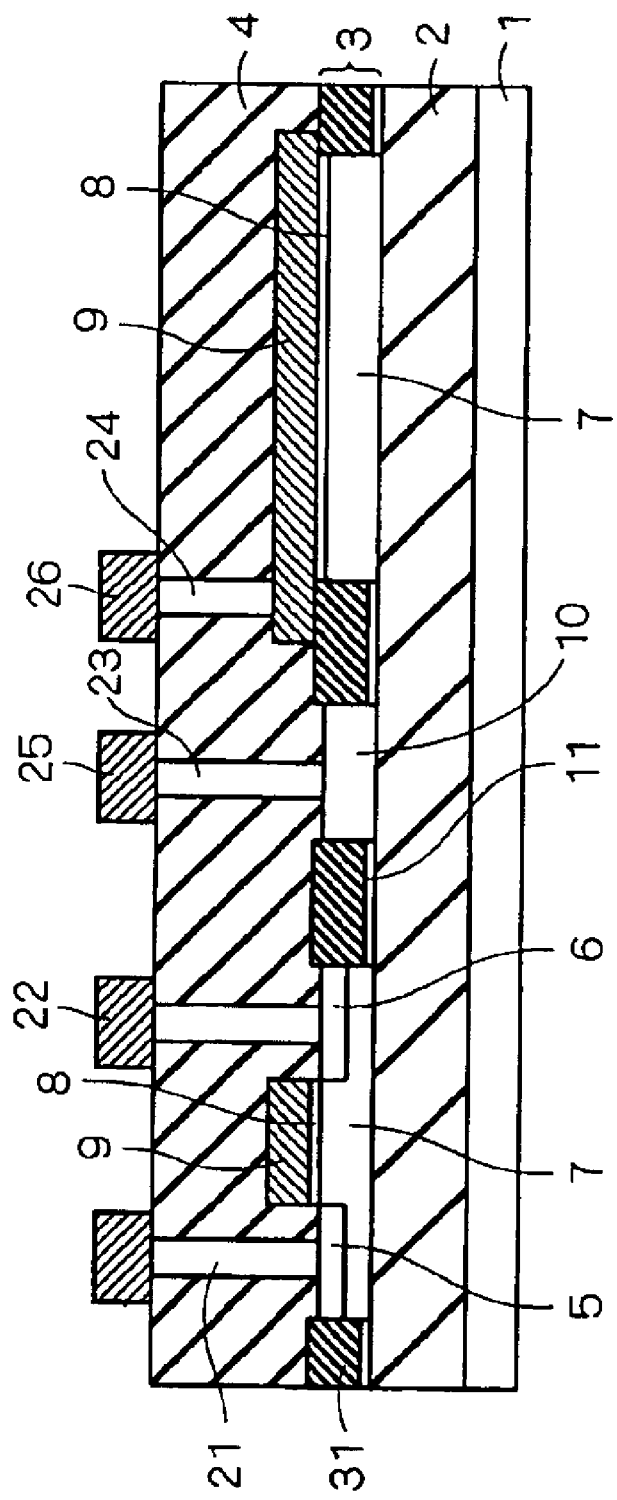
F I G . 2

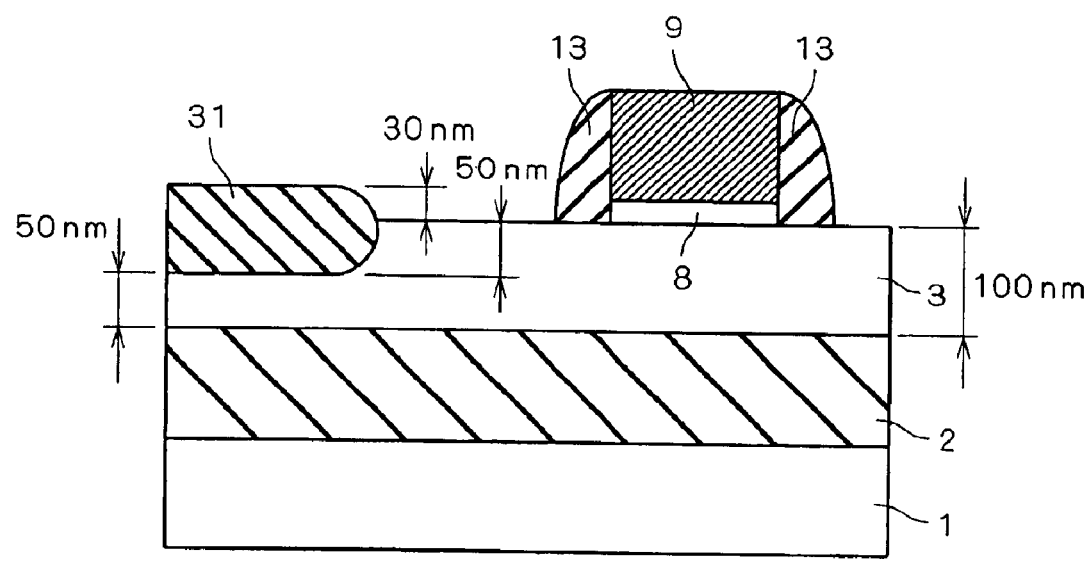
F I G . 12

F I G . 19
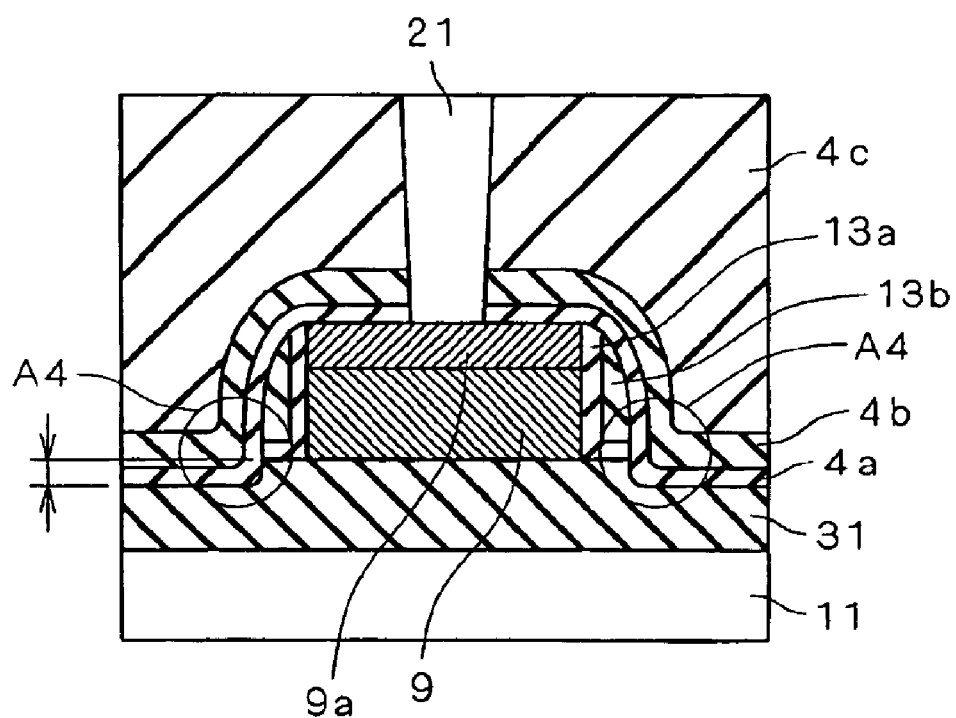

F I G . 3 1
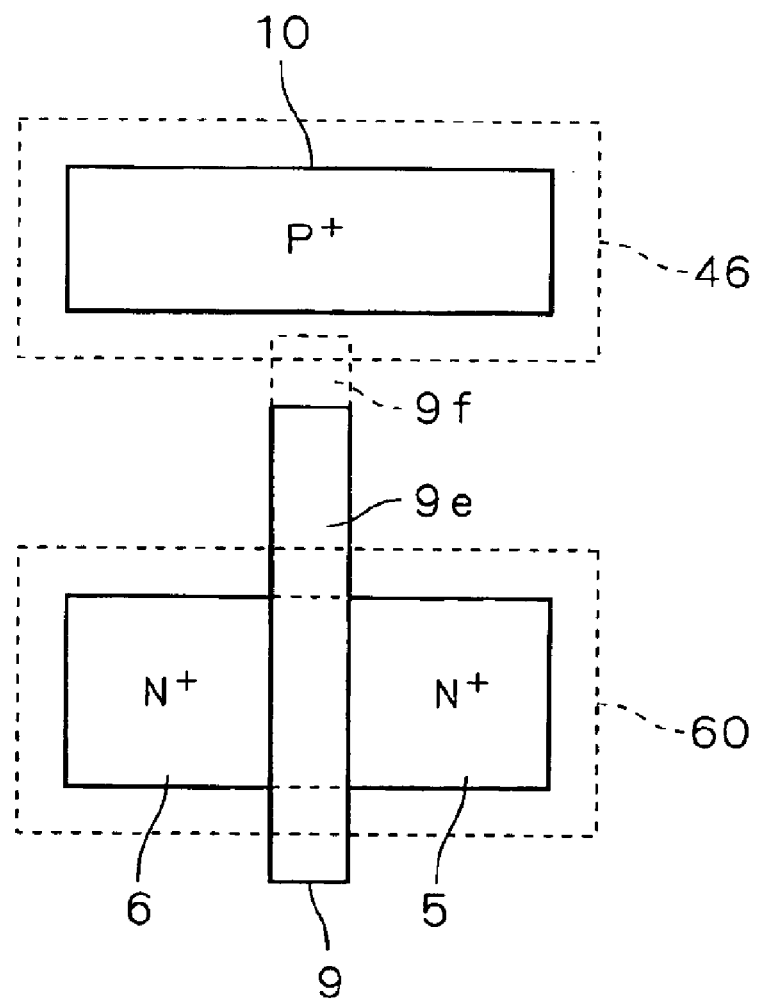

F I G . 3 2
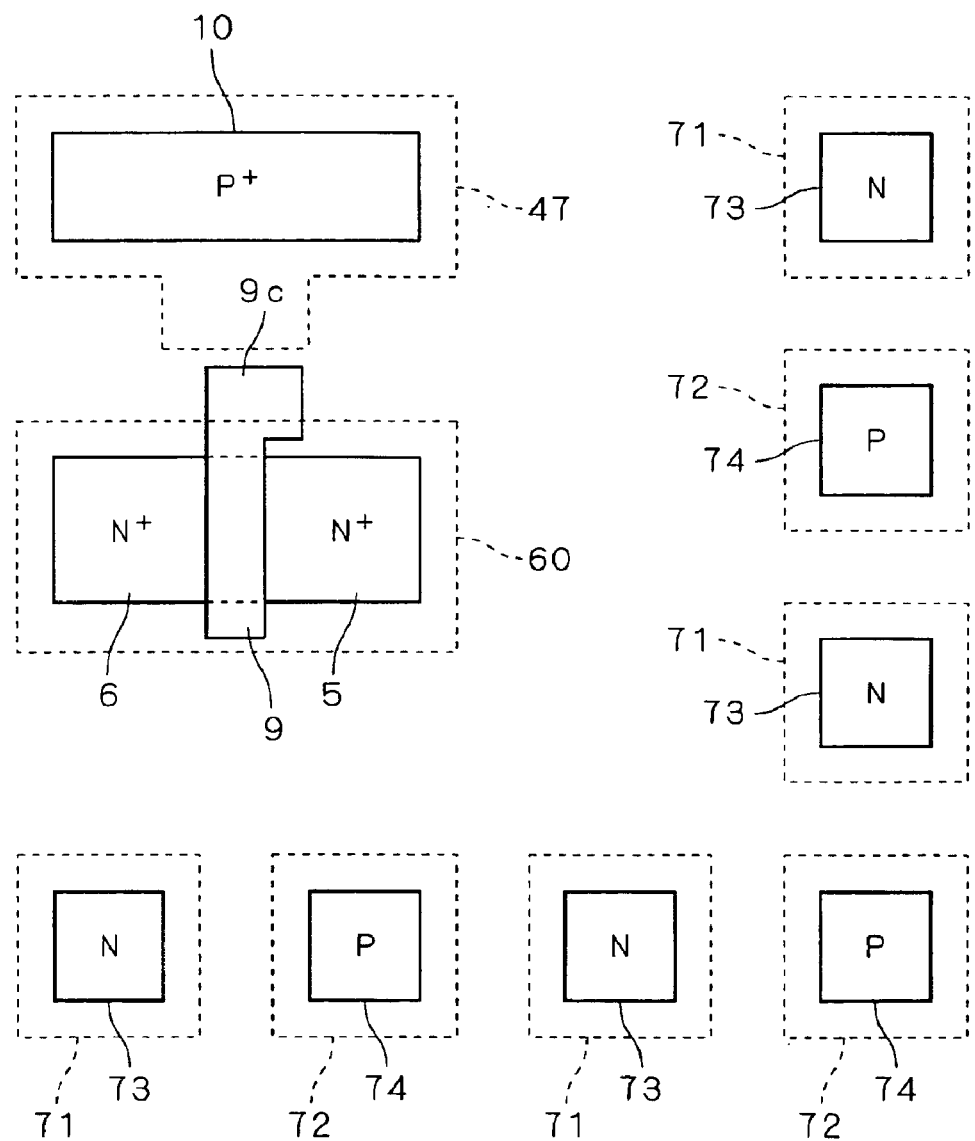

(PRIOR ART)

(PRIOR ART)

METHOD OF MANUFACTURING SEMICONDUCTOR DEVICE HAVING IMPURITY REGION UNDER ISOLATION REGION

REFERENCE TO RELATED APPLICATION

This Application is a Division of application Ser. No. 09/988,593 filed Nov. 20, 2001.

BACKGROUND OF THE INVENTION

1. Field of the Invention

The present invention relates to a semiconductor device having an SOI structure isolating elements from each other by an isolation film such as a partial insulator film partially leaving an SOI layer and a method of manufacturing the same.

2. Description of the Background Art

For example, each of "Y. Hirano et al., IEEE 1999 SOI conf., p 131" (Reference 1), Japanese Patent Application Laid-Open No. 2000-243973 (U.S. patent application Ser. No. 09/466,934: Reference 2) and Japanese Patent Application No. 2000-39484 (U.S. patent application Ser. No. 09/639,953: Reference 3) discloses a semiconductor device having a conventional SOI structure (may hereinafter be referred to as "partially isolated body fixed SOI structure") isolating elements from each other by an isolation film such as a partial insulator film partially leaving an SOI layer and fixing the potential of a body region.

In such a semiconductor device having a partially isolated body fixed SOI structure, however, it is difficult to form a semiconductor element such as a MOSFET while precisely controlling body resistance. The reason therefor is now described in detail.

FIG. 33 is a sectional view for illustrating a problem of the conventional partially isolated body fixed SOI structure. As shown in FIG. 33, an SOI layer 3 is formed on an embedded oxide film 2 present on a silicon substrate (not shown), and subjected to element isolation by a partial oxide film 31. The partial oxide film 31 is formed to leave a well region 11, which is a lower part of the SOI layer 3, under the same.

A channel forming region 7 is formed in a transistor forming region of the SOI layer 3, so that a gate oxide film 8 and a gate electrode 9 are successively formed on the channel forming region 7.

On the other hand, a body region 10 is provided oppositely to the channel forming region 7 through the partial oxide film 31, and this body region 10 is electrically connected with the channel forming region 7 through the well region 11 located under the partial oxide film 31 since the well region 11 is in contact with the body region 10 and the channel forming region 7 respectively.

In order to form a source/drain region of a MOS transistor, S/D impurity ions 19 are implanted through the gate electrode 9 etc. serving as masks as shown in FIG. 33, while no mask is provided (no resist film is formed) on the partial oxide film 31 in general.

When forming the source/drain region, therefore, the S/D impurity ions 19 may be partially implanted into the well region 11 located under the partial oxide film 31 to increase the resistance value of body resistance, which is the resistance of the well region 11 reaching the channel forming region 7 from the body region 10, disadvantageously resulting in unstable high-speed operation of the MOS transistor.

As the S/D impurity ions 19 for forming the source/drain region, As (arsenic) ions are implanted under conditions of 50 keV (injection energy) and $4 \times 10^{15}/cm^2$ (dose), for example.

FIG. 34 is a graph showing the impurity profile of As implanted under the aforementioned conditions. As shown in FIG. 34, the impurity profile has standard deviation σ (=8.5 nm) with reference to 26 nm, reaching a range of 51.5 nm (=26+3σ (nm)).

When the thickness of the partial oxide film 31 is reduced to about 50 nm, therefore, the impurity ions 19 of As disadvantageously reach the well region 11. Also when the thickness of the partial oxide film 31 is slightly larger than 50 nm, the As ions may still be implanted into the partial oxide film 31 since the tail part of the impurity profile is deeper than 51.5 nm.

In order to reduce a leakage current from a silicide region of $CoSi_2$ (cobalt silicide) or the like, P (phosphorus) is implanted under conditions of about 30 to 50 keV and about $1 \times 10^{13}/cm^2$. However, P has a higher possibility of reaching the well region 11 than As, due to a range deeper than that of As.

When trench isolation is employed, the partial oxide film 31 is formed by CMP (chemical mechanical polishing). Therefore, the thickness of the partial oxide film 31 is remarkably dispersed by about ±30 nm, for example, depending on pattern density or the position in a wafer surface.

Therefore, the partial oxide film 31 must be formed while setting a margin in consideration of the aforementioned dispersion. When the thickness of the partial oxide film 31 is so set that the As ions 19 for forming the source/drain region are not implanted into the well region 11 located under the partial oxide film 31, however, an isolation step 32 between the surface of the SOI layer 3, which is the surface of the SOI substrate, and the surface of the partial oxide film 31 reaches an unignorable level, as shown in FIG. 35.

Consequently, a residue 33 may be left on a side surface of the partial oxide film 31 as shown in FIG. 35. If an etching time for gate formation is increased for preventing formation of the residue 33, the gate oxide film 8 is disadvantageously damaged and reduced in reliability.

FIG. 36 is a plan view of a semiconductor device having the conventional partially separated body fixed SOI structure. FIG. 33 is a sectional view taken along the line C—C in FIG. 36. When an N-type impurity is implanted for forming the source/drain region, an $N^+$ block region 40 covering the overall body region 10 is masked with a resist film or the like, so that the N-type impurity is not implanted into the P-type body region 10.

As shown in FIG. 36, the $N^+$ block region 40 is generally formed in the minimum necessary size for reliably covering the body region 10, so that the gate oxide film 8 is not charged and statically damaged by a charge-up phenomenon.

When a P-type impurity is implanted into the body region 10, on the other hand, a $P^+$ block region 39 entirely covering an N-type drain region 5 and an N-type source region 6 is masked with a resist film or the like, so that the P-type impurity is not implanted into the drain region 5 and the source region 6.

As shown in FIG. 36, further, the $P^+$ block region 39 is generally formed in the minimum necessary size for reliably covering the drain region 5 and the source region 6, for a reason similar to that for the $N^+$ block region 40.

As hereinabove described, the source/drain region and the body region 10 are formed while masking the $N^+$ block region 40 and the $P^+$ block region 39 respectively, and hence it follows that both of the N- and P-type impurities are implanted into regions other than the N+ block region 40 and the P+ block region 39.

Consequently, the impurities are implanted into the well region 11 electrically connecting the body region 10 with the channel forming region 7 (not illustrated in FIG. 36 but present in the SOI layer 3 located under the gate electrode 9 as shown in FIG. 33), to cause such inconvenience that the resistance value of the body resistance R1 of the well region 11 reaching the channel forming region 7 from the body region 10 is increased or dispersed. Thus, it is difficult to precisely control the body resistance R1.

When the resistance value of the body resistance R1 is increased, the threshold voltage of the transistor fluctuates to disadvantageously resulting in unstable operation. This problem is disclosed in "S. Maeda et al., IEEE Transaction on Electron Devices, vol. 45, No. 7, pp. 1479 to 1486 (1998)", for example.

The body resistance serves as a noise source increasing noise of the transistor. When a circuit such as a PLL (phase locked loop) circuit is formed by a transistor having unstable body resistance, therefore, phase noise (phase jitter) is disadvantageously increased.

Thus, it is important for a semiconductor device having a partially isolated body fixed SOI structure to reduce and stably control body resistance.

SUMMARY OF THE INVENTION

According to a first aspect of the present invention, a semiconductor device having an SOI structure formed by a semiconductor substrate, an embedded insulating layer and an SOI layer comprises a plurality of element forming regions provided in the SOI layer, each formed with a prescribed element, an isolation film provided in an upper layer part of the SOI layer for isolating the plurality of element forming regions from each other, a first conductivity type semiconductor region, provided under the isolation film as part of the SOI layer, formed in contact with at least one element forming region having a first conductivity type among the plurality of element forming regions, and a first conductivity type body region, provided in the SOI layer and capable of being externally fixed in electric potential, formed in contact with the semiconductor region, while the semiconductor region at least partially has a first conductivity type impurity region not mixed with an impurity of a second conductivity type different from the first conductivity type but doped by only an impurity of the first conductivity type.

In the semiconductor device according to the first aspect, the semiconductor region located immediately under the isolation film at least partially has the first conductivity type impurity region consisting of only the impurity of the first conductivity type, whereby the resistance value of body resistance, which is the resistance of the semiconductor region reaching at least one element forming region from the body region, can be reduced.

According to a second aspect of the present invention, the first conductivity type impurity region is formed in a region reaching at least one element forming region from the body region.

In the semiconductor device according to the second aspect, the first conductivity type impurity region is formed in the region reaching at least one element forming region from the body region, whereby the resistance value of the body resistance can be further reduced.

According to a third aspect of the present invention, the isolation film at least partially has a second conductivity type impurity-free region containing no impurity of the second conductivity type.

In the semiconductor device according to the third aspect, the isolation film at least partially has the second conductivity type impurity-free region containing no impurity of the second conductivity type, whereby such inconvenience that the thickness of the isolation film is reduced by wet treatment after formation of the isolation film or the like can be suppressed.

According to a fourth aspect of the present invention, the second conductivity type impurity-free region is formed in a region reaching at least one element forming region from the body region.

In the semiconductor device according to the fourth aspect, the second conductivity type impurity-free region is formed in the region reaching at least one element forming region from the body region in the direction of the body resistance, whereby bad influence exerted on the body resistance by such a phenomenon that the thickness of the isolation film is increased can be more effectively suppressed.

According to a fifth aspect of the present invention, the second conductivity type impurity-free region includes a region having a larger thickness than the remaining region in the isolation film.

In the semiconductor device according to the fifth aspect, the thickness of the second conductivity type impurity-free region is not reduced by wet treatment after formation of the isolation film but is larger than that of another region reduced by the wet treatment as a result.

Therefore, no bad influence is exerted on the body resistance of the semiconductor region located immediately under the second conductivity type impurity-free region.

According to a sixth aspect of the present invention, the prescribed element includes a transistor, and a gate electrode of the transistor is formed to extend on the isolation film.

In the semiconductor device according to the sixth aspect, the gate electrode of the transistor is formed to extend on the isolation film, whereby the semiconductor region located under the gate electrode can be effectively inhibited from implantation of the impurity of the second conductivity type after formation of the gate electrode.

According to a seventh aspect of the present invention, the semiconductor device further comprises a dummy region formed in the SOI layer not to function as an element.

The semiconductor device according to the seventh aspect further comprises the dummy region not functioning as an element, whereby an area for forming a resist film serving as an opening preferential mask can be reduced by providing an opening on the dummy region when implanting an impurity into the SOI layer through an opening preferential mask system providing an opening on a region for implanting an impurity.

According to an eighth aspect of the present invention, the dummy region includes a region where impurities of both of the first conductivity type and the second conductivity type are introduced.

In the semiconductor device according to the eighth aspect, the dummy region includes the region where the impurities of both of the first and second conductivity types are introduced, whereby areas for forming first and second resist films serving as opening preferential masks for the first and second conductivity types can be reduced by providing openings on the first and second dummy regions respectively.

According to a ninth aspect of the present invention, the dummy region includes a first dummy region where an impurity of the first conductivity type is implanted and no impurity of the second conductivity type is implanted and a second dummy region where an impurity of the second conductivity type is implanted and no impurity of the first conductivity type is implanted.

In the semiconductor device according to the ninth aspect, the dummy region includes the first and second dummy regions where the impurities of both of the first and second conductivity types are introduced, whereby areas for forming first and second resist films serving as opening preferential masks for the first and second conductivity types can be reduced by providing openings on the first and second dummy regions respectively.

Further, an impurity of only one of the conductivity types is introduced into each of the first and second dummy regions, whereby no inconvenience results from implantation of both of the first and second conductivity type impurities.

According to a tenth aspect of the present invention, the isolation film includes an isolation film having a thickness of not more than 50 nm.

According to an eleventh aspect of the present invention, a semiconductor device having an SOI structure formed by a semiconductor substrate, an embedded insulating layer and an SOI layer comprises a plurality of element forming regions provided in the SOI layer, each formed with a prescribed element, an isolation film provided in an upper layer part of the SOI layer for isolating the plurality of element forming regions from each other, a first conductivity type semiconductor region, provided under the isolation film as part of the SOI layer, formed in contact with at least one element forming region having a first conductivity type among the plurality of element forming regions, and a first conductivity type body region, provided in the SOI layer and capable of being externally fixed in electric potential, formed in contact with the semiconductor region, while the isolation film at least partially has a region having a larger thickness than the remaining region.

According to a twelfth aspect of the present invention, a method of manufacturing a semiconductor device comprises steps of (a) preparing an SOI substrate formed by a semiconductor substrate, an embedded insulating layer and an SOI layer, (b) selectively forming an isolation film in an upper layer part of the SOI layer while forming a first conductivity type semiconductor region in a lower layer part of the isolation film so that the isolation film separates the SOI layer into a plurality of element forming regions and at least one element forming region has a first conductivity type and is formed in contact with the semiconductor region among the plurality of element forming regions, (c) selectively forming a second conductivity type active region on the surface of at least one element forming region, and (d) forming a first conductivity type body region capable of being externally fixed in electric potential in the SOI layer to be in contact with the semiconductor region, while the step (c) is carried out for forming the active region by setting a block region including the body region and a partial region of the isolation film to a region inhibiting introduction of an impurity of the second conductivity type and introducing the impurity of the second conductivity type into the SOI layer.

The method of manufacturing a semiconductor device according to the twelfth aspect sets the block region including the body region and the partial region in the isolation film to the region inhibiting introduction of the second conductivity type impurity while introducing the second conductivity type impurity into the SOI layer thereby forming the active region, whereby the resistance value of body resistance which is the resistance of the semiconductor region reaching at least one element forming region from the body region can be reduced since the semiconductor region located under the block region can be reliably inhibited from implantation of the second conductivity type impurity.

According to a thirteenth aspect of the present invention, the step (c) includes a step of introducing an impurity of the second conductivity type into the SOI layer through a mask of a first resist film formed on the block region.

The method of manufacturing a semiconductor device according to the thirteenth aspect can inhibit the semiconductor region located under the block region from implantation of the second conductivity type impurity by the first resist film.

According to a fourteenth aspect of the present invention, at least one element forming region includes a region for forming a transistor, the method further comprises (e) a step executed in advance of the step (c) for forming a gate electrode of the transistor on at least one element forming region extend on the isolation film, and the step (c) includes a step of introducing an impurity of the second conductivity type into the SOI layer through masks of the first resist film and the gate electrode.

The method of manufacturing a semiconductor device according to the fourteenth aspect can inhibit the semiconductor region located under the block region and the gate electrode from implantation of the second conductivity type impurity by the first resist film and the gate electrode.

According to a fifteenth aspect of the present invention, the first resist film and the gate electrode are continuously formed on a region reaching at least one element forming region from the body region.

In the method of manufacturing a semiconductor device according to the fifteenth aspect, the first resist film and the gate electrode are continuously formed on the region reaching at least one element forming region from the body region, whereby the resistance value of the body resistance can be further reduced.

According to a sixteenth aspect of the present invention, at least one element forming region includes a region for forming a transistor, the method further comprises (e) a step executed in advance of the step (c) for forming a gate electrode of the transistor on at least one element forming region to extend on part of the isolation film, and the step (c) includes a step of introducing an impurity of the second conductivity type into the SOI layer through masks of a first resist film formed on the body region and the gate electrode.

The method of manufacturing a semiconductor device according to the sixteenth aspect can inhibit the semiconductor region located under the gate electrode from implantation of the second conductivity type impurity by the gate electrode.

According to a seventeenth aspect of the present invention, the gate electrode is formed on a region reaching at least one element forming region from the body region.

In the method of manufacturing a semiconductor device according to the seventeenth aspect, the gate electrode is formed on the region reaching at least one element forming region from the body region, whereby the resistance value of the body resistance can be further reduced.

According to an eighteenth aspect of the present invention, the step (c) includes a step of introducing an impurity of the second conductivity type into the SOI layer through a mask of a first resist film having a first opening on the active region, and the step (d) includes a step of introducing an impurity of the first conductivity type into the SOI layer through a mask of a second resist film having a second opening on the body region.

The method of manufacturing a semiconductor device according to the eighteenth aspect carries out the steps (c) and (d) with the first and second resist films of an opening preferential mask system having the first and second openings in regions to be subjected to introduction of the second and first conductivity type impurities respectively, whereby the resistance value of the body resistance can be further reduced since the semiconductor region can be inhibited from introduction of the second and first conductivity type impurities in execution of the steps (c) and (d).

According to a nineteenth aspect of the present invention, the second opening includes an opening provided substantially only on the body region.

The second opening of the second resist film employed in the step (d) of the method of manufacturing a semiconductor device according to the nineteenth aspect includes the opening provided substantially only on the body region, whereby no first conductivity type impurity is introduced into most regions of the isolation film in execution of the step (d).

According to a twentieth aspect of the present invention, the second opening includes an opening provided on the body region and part of the isolation film.

The second opening of the second resist film employed in the step (d) of the method of manufacturing a semiconductor device according to the twentieth aspect includes the opening provided on the body region and part of the isolation film, whereby the resistance value of the body resistance can be reduced by introducing the first conductivity type impurity into the semiconductor region located under the second opening in execution of the step (d). This effect is sufficiently larger than such inconvenience that the first conductivity type impurity is introduced into the isolation film located under the second opening.

According to a twenty-first aspect of the present invention, the second opening includes an opening provided on a region reaching at least one element forming region from the body region.

In the method of manufacturing a semiconductor device according to the twenty-first aspect, the first conductivity type impurity is implanted into the region reaching at least one element forming region from the body region in the semiconductor region from the second opening, whereby the resistance value of the body resistance can be further reduced.

According to a twenty-second aspect of the present invention, the first resist film further has a first dummy opening on a region other than the body region, the semiconductor region and at least one element forming region, and the second resist film further has a second dummy opening on a region other than the body region, the semiconductor region and at least one element forming region.

The method of manufacturing a semiconductor device according to the twenty-second aspect can reduce the areas for forming the first and second resist films due to the first and second dummy openings provided on the first and second resist films.

According to a twenty-third aspect of the present invention, the first and second dummy openings are formed on the same position in the same shape.

The method of manufacturing a semiconductor device according to the twenty-third aspect can apply a dummy pattern having the first (second) dummy opening to the first and second resist films in common by forming the first and second dummy openings on the same position in the same shape.

According to a twenty-fourth aspect of the present invention, the first and second dummy openings are formed without overlapping with each other.

The method of manufacturing a semiconductor device according to the twenty-fourth aspect can reduce the areas for forming the first and second resist films by providing the first and second dummy openings in the first and second dummy regions.

Further, an impurity of only one of the conductivity types is introduced into each of the first and second dummy regions formed by introducing the first and second conductivity types through the first and second dummy openings, whereby no inconvenience results from implantation of both of the first and second conductivity type impurities.

An object of the present invention is to obtain a semiconductor device having a partially isolated body fixed SOI structure attaining reduction of body resistance and a method of manufacturing the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are first and second sectional views showing a semiconductor device having a partially isolated body fixed SOI structure forming the basis of the present invention;

FIG. 12 is a sectional view showing a semiconductor device having a general partially isolated body fixed SOI structure;

FIGS. 18 and 19 are sectional views showing a sectional structure of the semiconductor device having a partially isolated body fixed SOI structure manufactured by the method according to the embodiment 2;

FIG. 31 is a plan view showing a method of manufacturing a semiconductor device having a partially isolated body fixed SOI structure according to an embodiment 11 of the present invention;

FIG. 32 is a plan view showing a method of manufacturing a semiconductor device having a partially isolated body fixed SOI structure according to an embodiment 12 of the present invention;

FIG. 34 is a graph showing an impurity profile of As;

DESCRIPTION OF THE PREFERRED EMBODIMENTS

<Basic Structure>

Figure 1:
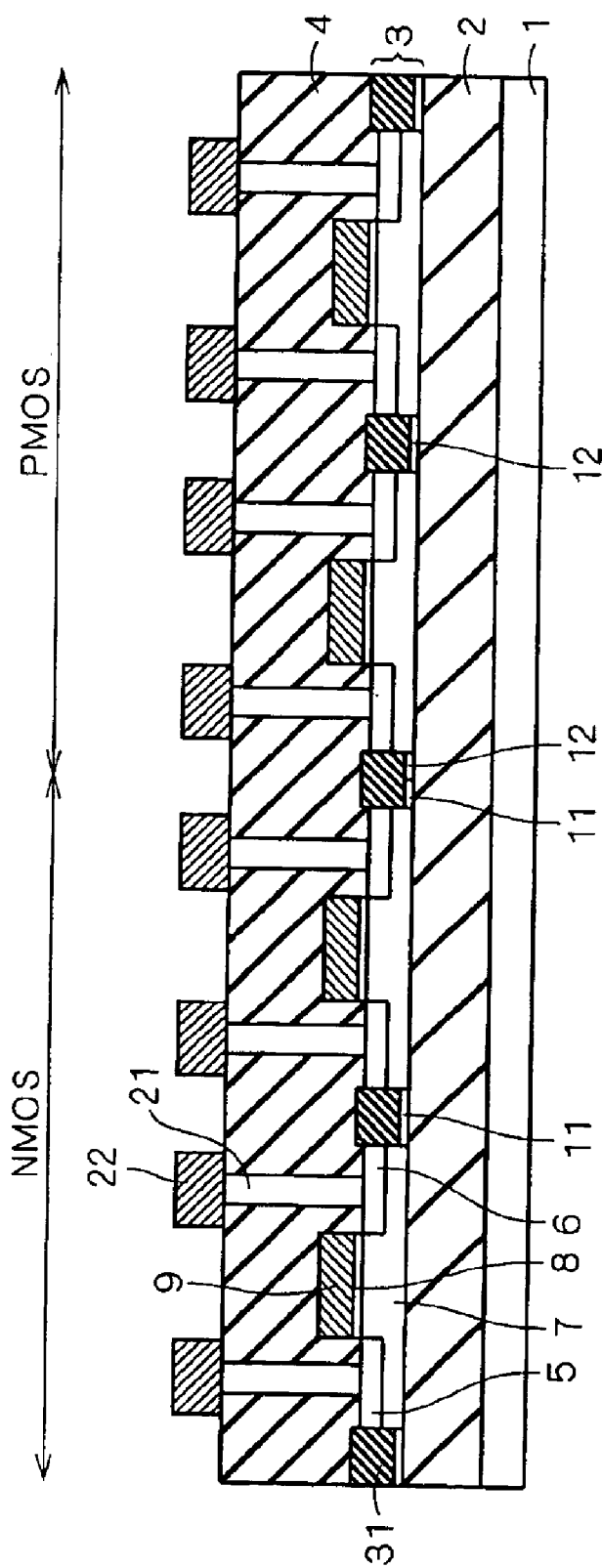
Figure 3:
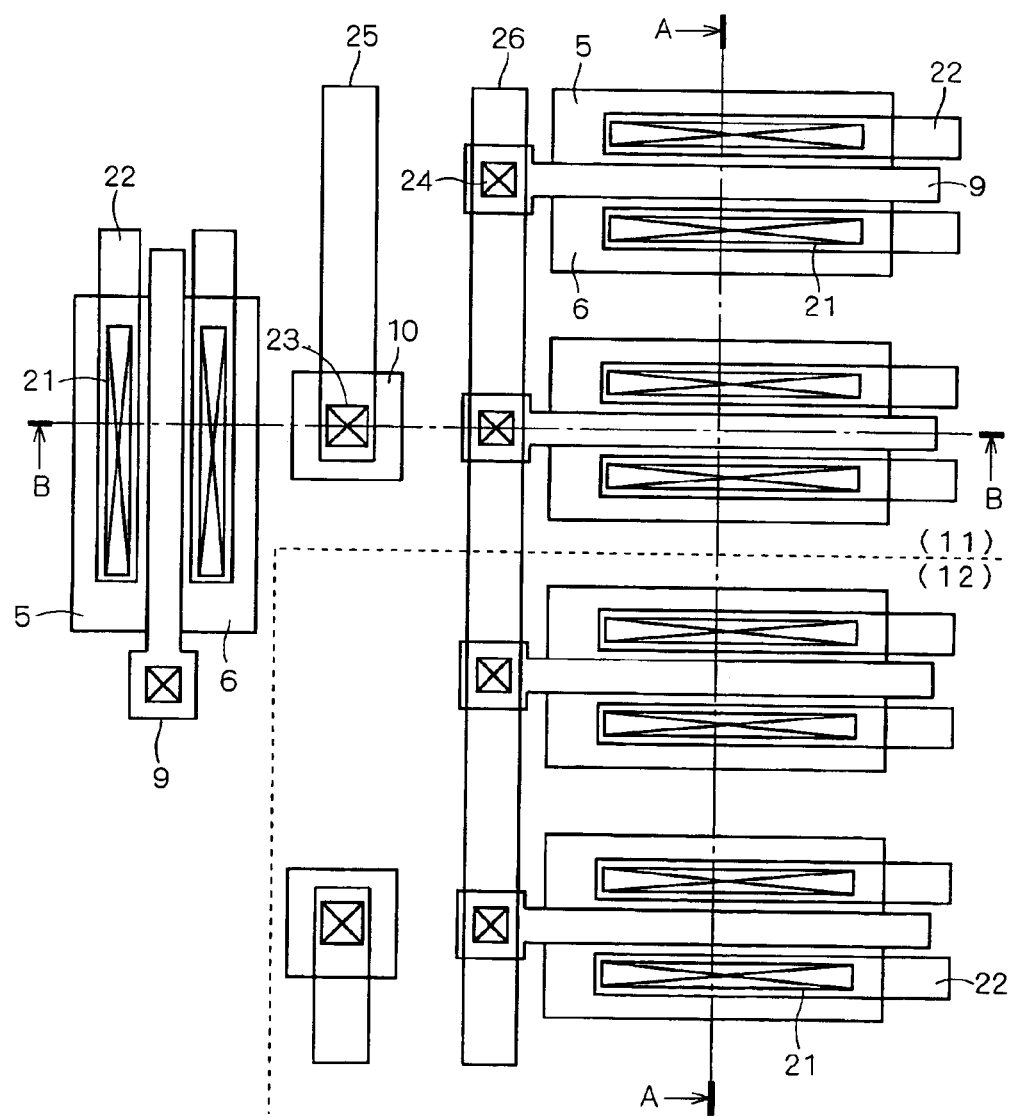
FIG. 3 is a plan view showing the semiconductor device having a partially isolated body fixed SOI structure forming the basis of the present invention.

FIGS. 1 to 3 illustrate the structure of a semiconductor device having a partially isolated body fixed SOI structure forming the basis of the present invention. FIGS. 1 and 2 are sectional views, and FIG. 3 is a plan view. FIGS. 1 and 2 are sectional views taken along the lines A—A and B—B in FIG. 3 respectively.

As shown in FIGS. 1 to 3, partial oxide films 31 formed with well regions 11 and 12 on lower layer parts thereof isolate respective transistor forming regions of an SOI layer 3 of the semiconductor device having an SOI structure formed by a silicon substrate 1, an embedded oxide film 2 and the SOI layer 3. In other words, a p-type well region 11 is formed under the partial oxide film 31 isolating NMOS transistors from each other, an n-type well region 12 is formed under the partial oxide film 31 isolating PMOS transistors from each other, and a p-type well region 11 (NMOS transistor forming region side) and an n-type well region 12 (PMOS transistor forming region side) are formed under the partial oxide film 31 (isolation film) isolating the NMOS and PMOS transistors from each other.

As shown in FIG. 3, the well region 11 is formed to enclose drain regions 5 and source regions 6 of the NMOS transistor group, and the well region 12 is formed to enclose drain regions 5 and source regions 6 of the PMOS transistor group. In this basic structure, the SOI layer 3 is covered with an interlayer isolation film 4.

In this basic structure, a single-unit MOS transistor isolated from another transistor by the partial oxide film 31 is formed by the drain region 5, the source region 6 and a channel forming region 7 formed in the SOI layer 3, a gate oxide film 8 formed on the channel forming region 7 and a gate electrode 9 formed on the gate oxide film 8. A wiring layer 22 formed on the interlayer isolation film 4 is electrically connected with the drain region 5 or the source region 6 through a contact 21 provided in the interlayer isolation film 4. Although the contact 21 is largely drawn, a plurality of small holes may be opened for preparing contacts.

As shown in FIGS. 2 and 3, a body region 10 is formed between the well regions 11 in the SOI layer 3, to be in contact with the adjacent well regions 11. A wiring layer 25 formed on the interlayer isolation film 4 is electrically connected with the body region 10 through a body contact 23 provided in the interlayer isolation film 4. A wiring layer 26 formed on the interlayer isolation film 4 is electrically connected with the gate electrode 9 through a gate contact 24 provided in the interlayer isolation film 4.

Thus, in the semiconductor device having this basic structure, the partial oxide films 31 of element isolation regions do not reach a lower portion of the SOI layer 3 but the well regions 11 and 12 into which impurities of the same conductivity types as the channel forming regions of the transistors to be isolated from each other are provided under the partial oxide films 31.

Therefore, a substrate potential of each transistor can be externally fixed through the wiring layer 25, the body contact 23 and the body region 10 and the well regions 11 of high-concentrations. Also on the side of the PMOS transistor, the substrate potential of each respective transistor can be fixed through the body region 10.

The details are now described with reference to FIGS. 1 to 3. The thickness of the embedded oxide film 2 is about 100 to 500 nm, for example, and the thickness of the SOI layer 3 is about 30 to 200 nm. The channel forming region 7 is formed by introducing about $10^{17}$ to $10^{18}/cm^3$ of a first conductivity type impurity (a p-type impurity for the NMOS transistor or an n-type impurity for the PMOS transistor). The drain region 5 and the source region 6 are formed by introducing about $10^{18}$ to $10^{21}/cm^3$ of a second conductivity type impurity (an n-type impurity for the NMOS transistor or a p-type impurity for the PMOS transistor) adjacently to the channel forming region 7.

Each partial oxide film 31 isolating adjacent transistors from each other is formed while leaving a lower layer part of the SOI layer 3 by about 10 to 100 nm, for example, for forming the well region.

The well regions 11 and 12 (having impurity concentrations of $10^{17}$ to $5 \times 10^{18}/cm^3$, for example, which are identical to or in excess of those of the channel forming regions; punch-through phenomena can be prevented and isolation performance is improved as the concentrations are increased) having the same conductivity types as the channel forming regions are provided on the lower parts of the partial oxide films 31 for isolating oxide films from each other.

As shown in FIG. 2, a high-concentration impurity of $10^{18}$ to $10^{21}/cm^3$ having the same conductivity type as the adjacent well regions 11 is introduced into the body region 10.

Figure 37:
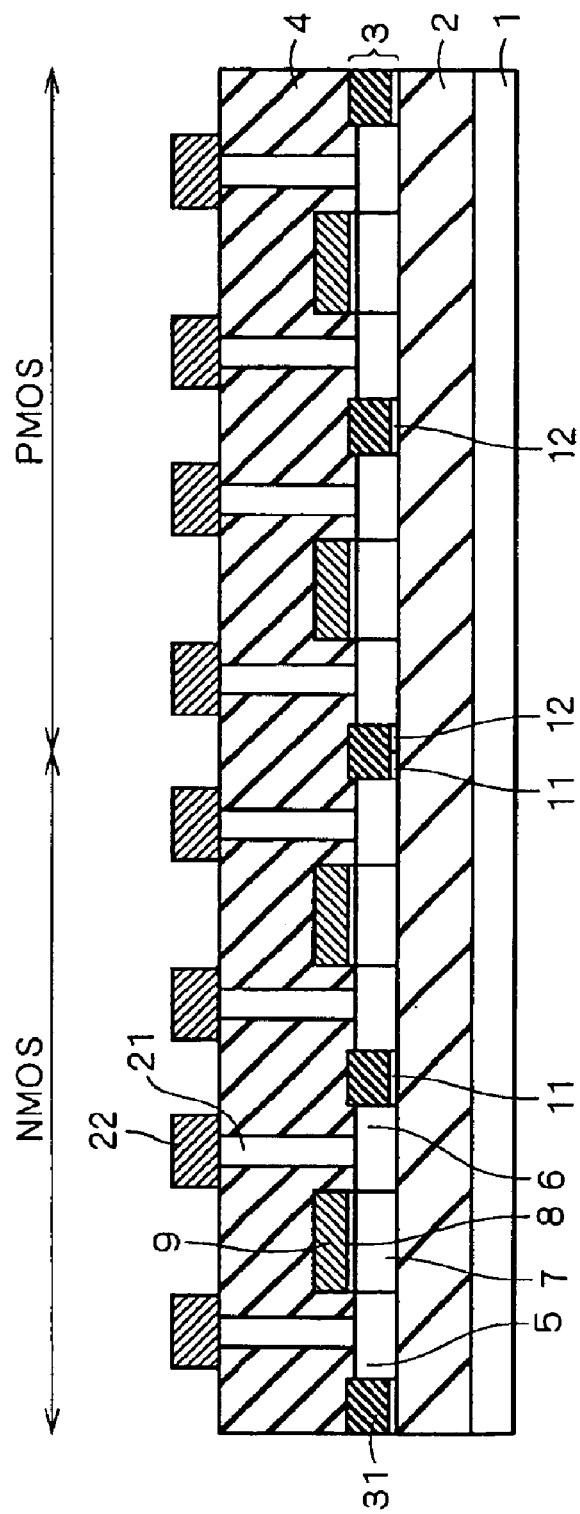
FIG. 37 is a sectional view showing the semiconductor device having a partially isolated body fixed SOI structure of FIG. 1 to which a different type of source-drain structure is applied.
Figure 38:
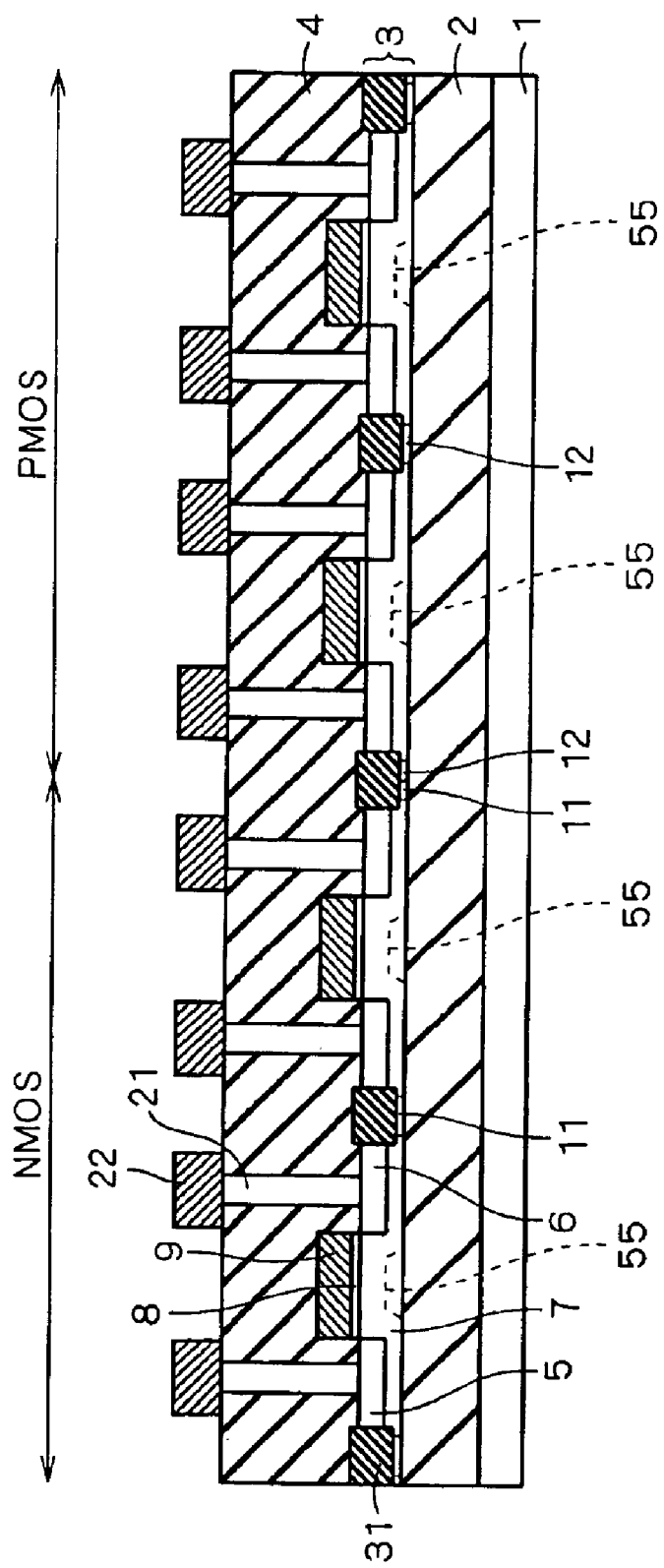
FIG. 38 is a sectional view showing the semiconductor device having a partially isolated body fixed SOI structure of FIG. 1 to which another different type of source-drain structure is applied.

While FIG. 1 shows a structure in which the drain region 5 and the source region 6 do not reach the embedded oxide film 2, it is preferable to employ a structure shown in FIG. 37 in which the drain region 5 and the source region 6 reach the embedded oxide film 2, or a structure shown in FIG. 38 in which a depletion layer 55 extending from the drain region 5 and the source region 6 reaches the embedded oxide film 2.

<Basic Method of Manufacturing MOS Transistor>

FIGS. 4 to 9 are sectional views showing a basic method of manufacturing the semiconductor device having a partially isolated body fixed SOI structure.

Figure 4:
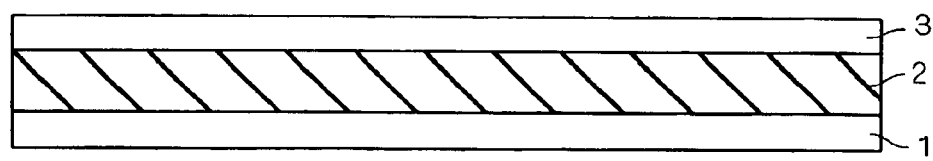
FIGS. 4 to 9 are sectional views showing a basic method of manufacturing the semiconductor device having a partially isolated body fixed SOI structure.

First, an SOI substrate consisting of the silicon substrate 1, the embedded oxide film 2 and the SOI layer 3 is formed as a starting material by an SIMOX method of forming the embedded oxide film 2 by oxygen ion implantation or the like, as shown in FIG. 4. In general, the thickness of the SOI layer 3 is 50 to 200 nm, and the thickness of the embedded oxide film 2 is 100 to 400 nm.

Figure 5:
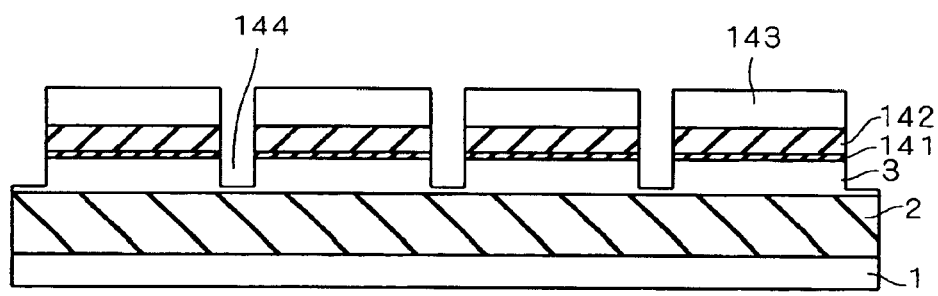

As shown in FIG. 5, an oxide film 141 of about 20 nm in thickness and a nitride film 142 of about 200 nm in thickness are successively deposited on the SOI substrate for thereafter patterning isolation regions through a mask of a patterned resist film 143 and etching the triple multilayer film of the nitride film 142, the oxide film 141 and the SOI layer 3 to leave the lower layer part of the SOI layer 3, thereby forming a plurality of partial trenches 144.

Figure 6:
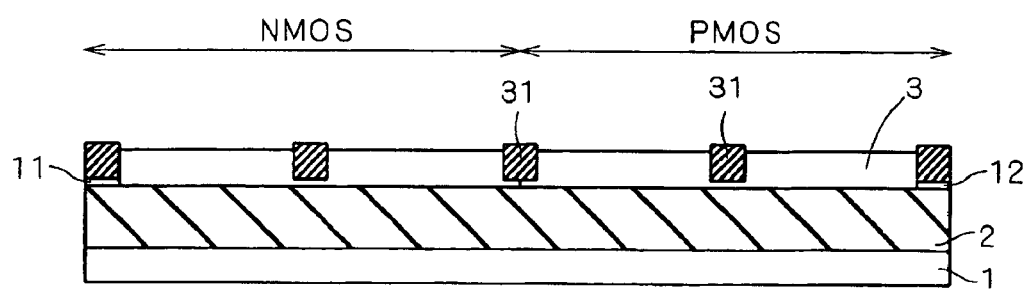

Then, an oxide film of about 500 nm is deposited so that a structure formed with the partial oxide films 31 and the SOI layer 3 (the well regions 11 and 12) located under the same can be obtained by polishing the nitride film 142 to an intermediate portion by CMP treatment by a method similar to that in general trench isolation and thereafter removing the nitride film 142 and the oxide film 141, as shown in FIG. 6.

Thereafter an existing CMOS transistor forming method of selectively implanting impurities or the like is employed for converting NMOS forming regions and PMOS forming regions of the SOI layer 3 to N- and P-type regions respectively.

Figure 7:
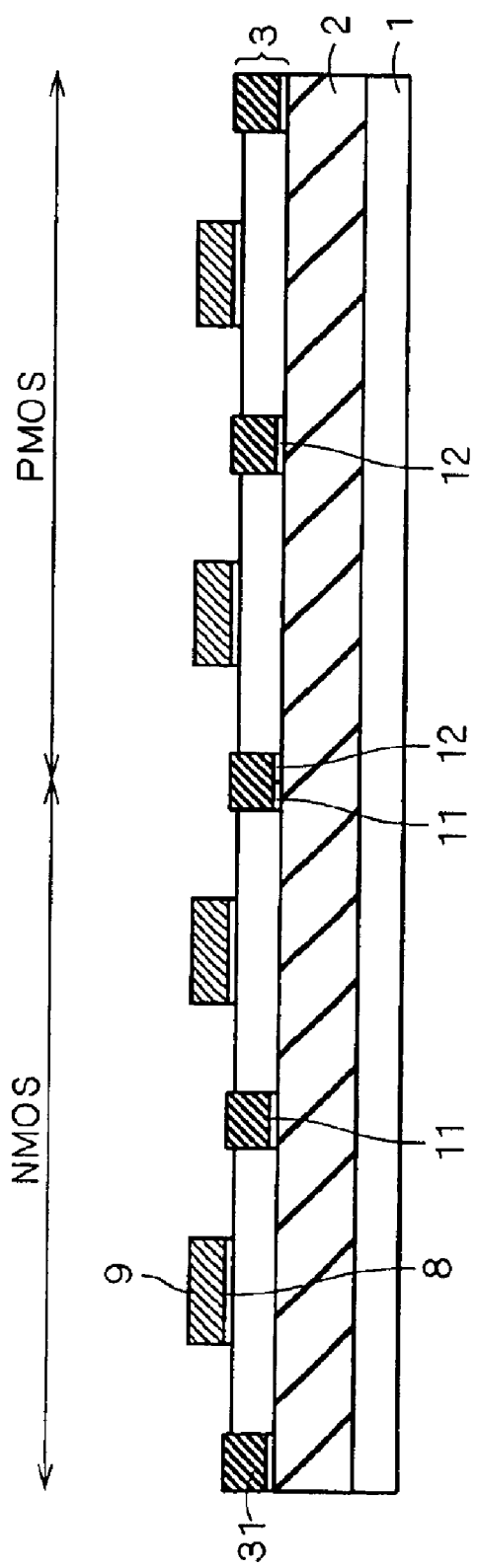

Then, the gate oxide films 8 and the gate electrodes 9 are selectively formed on the respective regions obtained by isolating the NMOS and PMOS regions by the partial oxide films 31 in units of MOS transistors, as shown in FIG. 7.

Figure 8:
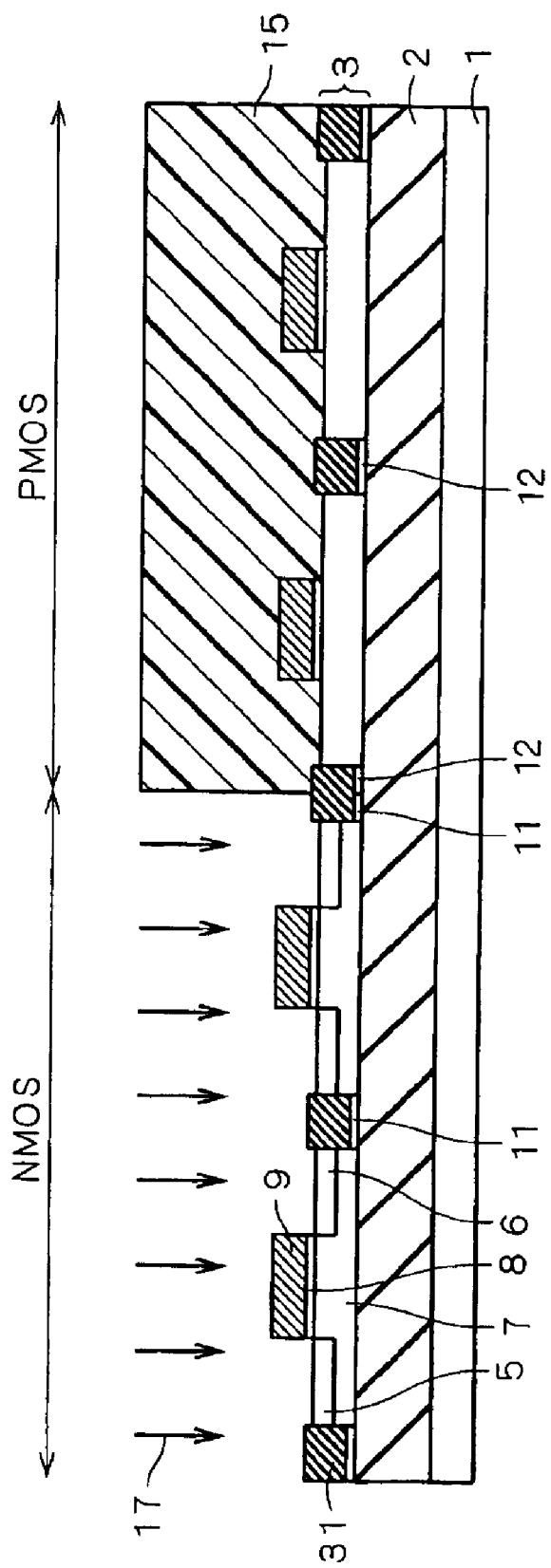

Thereafter a resist film 15 is formed on a region for forming a source/drain region on the side of a PMOS transistor forming region and a region for forming a body region on the side of an NMOS transistor for masking these regions, and N-type impurity ions 17 are implanted thereby simultaneously forming the drain region 5 and the source region 6 on the NMOS region and the body region (not shown) in the PMOS region, as shown in FIG. 8.

Figure 9:
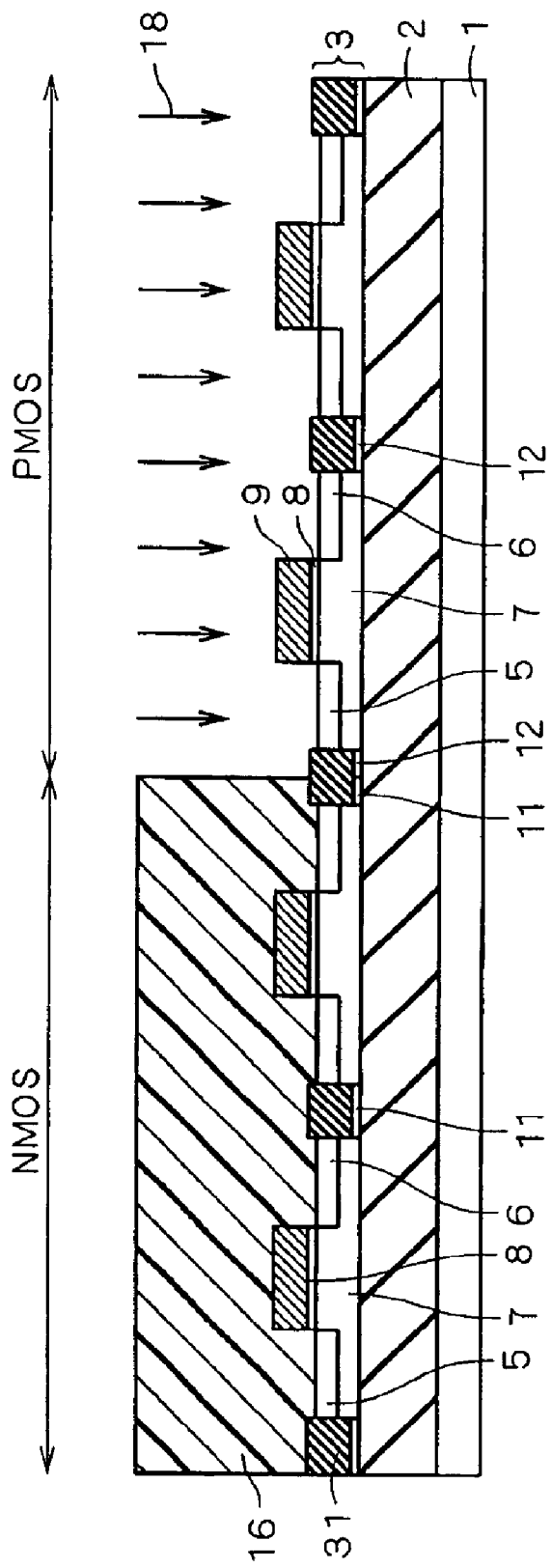

As shown in FIG. 9, the resist film 15 is removed and thereafter another resist film 16 is formed on the drain region 5 and the source region 6 on the side of the NMOS transistor and the body region (not shown) on the side of the PMOS transistor for masking these regions, and P-type impurity ions 18 are implanted thereby simultaneously forming the drain region 5 and the source region 6 in the PMOS region and the body region (not shown) on the NMOS region respectively.

The entire disclosure of Reference 1, Reference 2 and Reference 3 are herein incorporated by reference.

<Embodiment 1>

Figure 10:
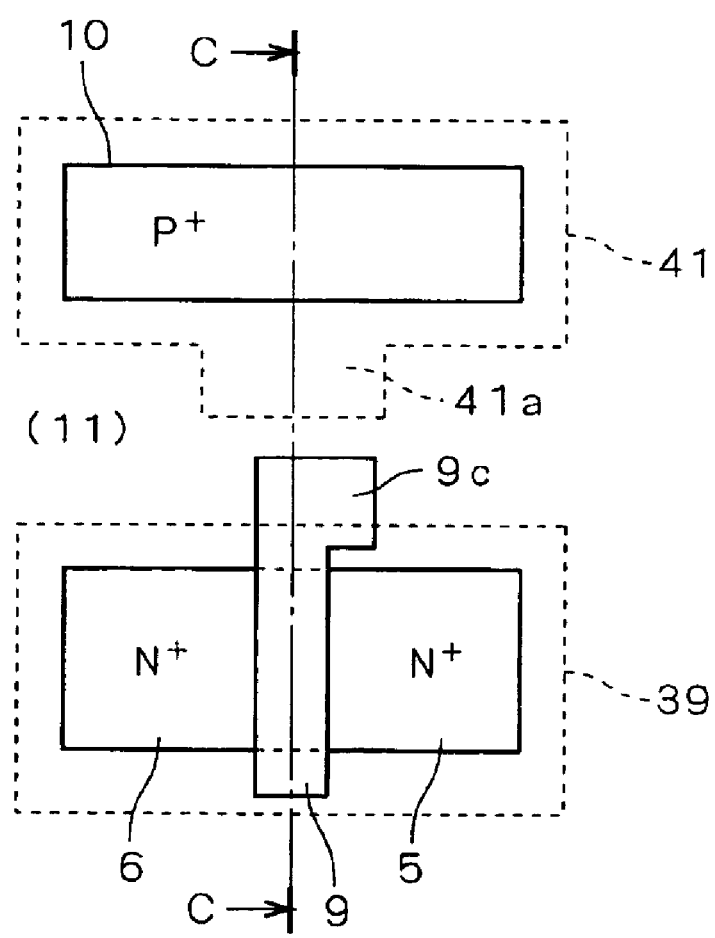
FIG. 10 is a plan view showing a method of manufacturing a semiconductor device having a partially isolated body fixed SOI structure according to an embodiment 1 of the present invention.

FIG. 10 is a plan view showing a method of manufacturing a semiconductor device having a partially isolated body fixed SOI structure according to an embodiment 1 of the present invention.

As shown in FIG. 10, a $P^+$ block region 39 is formed in the minimum necessary size for reliably covering regions (planned) for forming a drain region 5 and a source region 6 similarly to the prior art, while an $N^+$ block region 41 reliably covers a region (planned) for forming a body region 10 and has a gate-directional extension region 41a obtained by extending a partial region on an extension of a gate electrode 9 along the longitudinal direction (gate width direction) toward a gate contact region 9c.

The $P^+$ block region 39 indicates a resist film forming region in implantation of the P-type impurity ions 18 shown in FIG. 9, and the $N^+$ block region 41 indicates a resist film forming region in implantation of the N-type impurity ions 17 shown in FIG. 8.

Figure 11:
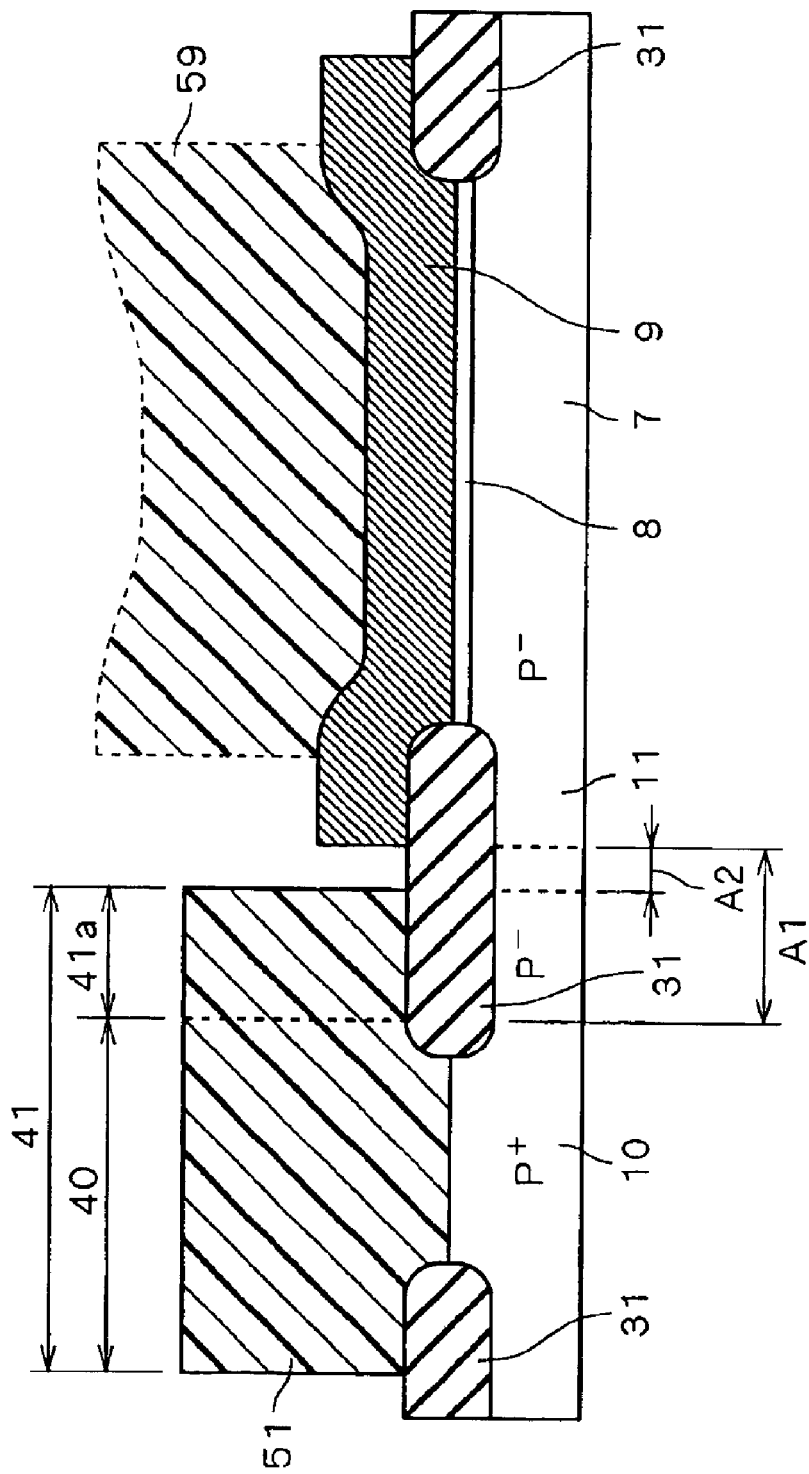
FIG. 11 is a sectional view showing a sectional structure of the semiconductor device according to the embodiment 1 in formation of a block resist film.

FIG. 11 is a sectional view taken along the line C—C in FIG. 10, showing a sectional structure in block resist formation according to the embodiment 1.

As shown in FIG. 11, an $N^+$ block resist film 51 is formed on the $N^+$ block region 41 extending toward the gate electrode 9 beyond the $N^+$ block region 40 of the prior art. Similarly, a $P^+$ block resist film 59 is formed on the $P^+$ block region 39.

While FIG. 11 illustrates both of the $N^+$ block resist film 51 and the $P^+$ block resist film 59 for convenience, the $N^+$ block resist film 51 and the $P^+$ block resist film 59 are not simultaneously present in practice but the $N^+$ block resist film 51 is provided in the step shown in FIG. 8 and the $P^+$ block resist film 59 is formed in the step shown in FIG. 9 in the manufacturing method shown in FIGS. 7 to 9.

As shown in FIG. 11, a high resistance forming region which is a well region 11 into which both N- and P-type impurities may be implanted on the longitudinal extension of the gate electrode 9 can be narrowed to a high resistance forming region A2 from a conventional high resistance forming region A1 by the gate-directional extension region 41a of the $N^+$ block region 41.

Thus, no N-type impurity is implanted into the well region 11 located under the gate-directional extension region 41a. In other words, the well region 11 located under the gate-directional extension region 41a is a P-type impurity region mixed with no N-type impurity, whereby the resistance value of body resistance can be reduced and dispersion can be suppressed. Consequently, a precisely controllable semiconductor device having a partially isolated body fixed SOI structure can be obtained without increasing the resistance value of the body resistance.

In addition, the number of manufacturing steps is not increased beyond that of the prior art by carrying out the manufacturing method according to the embodiment 1 changing the N+ block region 41 from the conventional N+ block region 40.

FIG. 12 is a sectional view showing a semiconductor device having a general partially isolated body fixed SOI structure. As shown in FIG. 12, it is assumed that a partial oxide film 31 is dug by 50 nm by trench etching when the thickness of an SOI layer 3 is 100 nm for forming the partial oxide film 31 to be provided with an isolation step projecting from the surface of the SOI layer 3 by 30 nm. Referring to FIG. 12, side walls 13 are formed on the side surfaces of a gate electrode 9.

Considering dispersion in CMP treatment (the step of FIG. 6), the isolation step of about ±30 nm fluctuates. Therefore, the thickness of the partial oxide film 31 changes in the range of 80±30 nm, i.e., 50 to 110 nm, to reach 50 nm at the worst so that an N-type impurity is disadvantageously implanted into the partial oxide film 31 to reduce body resistance. According to the manufacturing method of the embodiment 1, however, no N-type impurity is implanted into the well region 11 located under the gate-directional extension region 41a also in this case, and hence the aforementioned inconvenience can be avoided.

Figure 13:
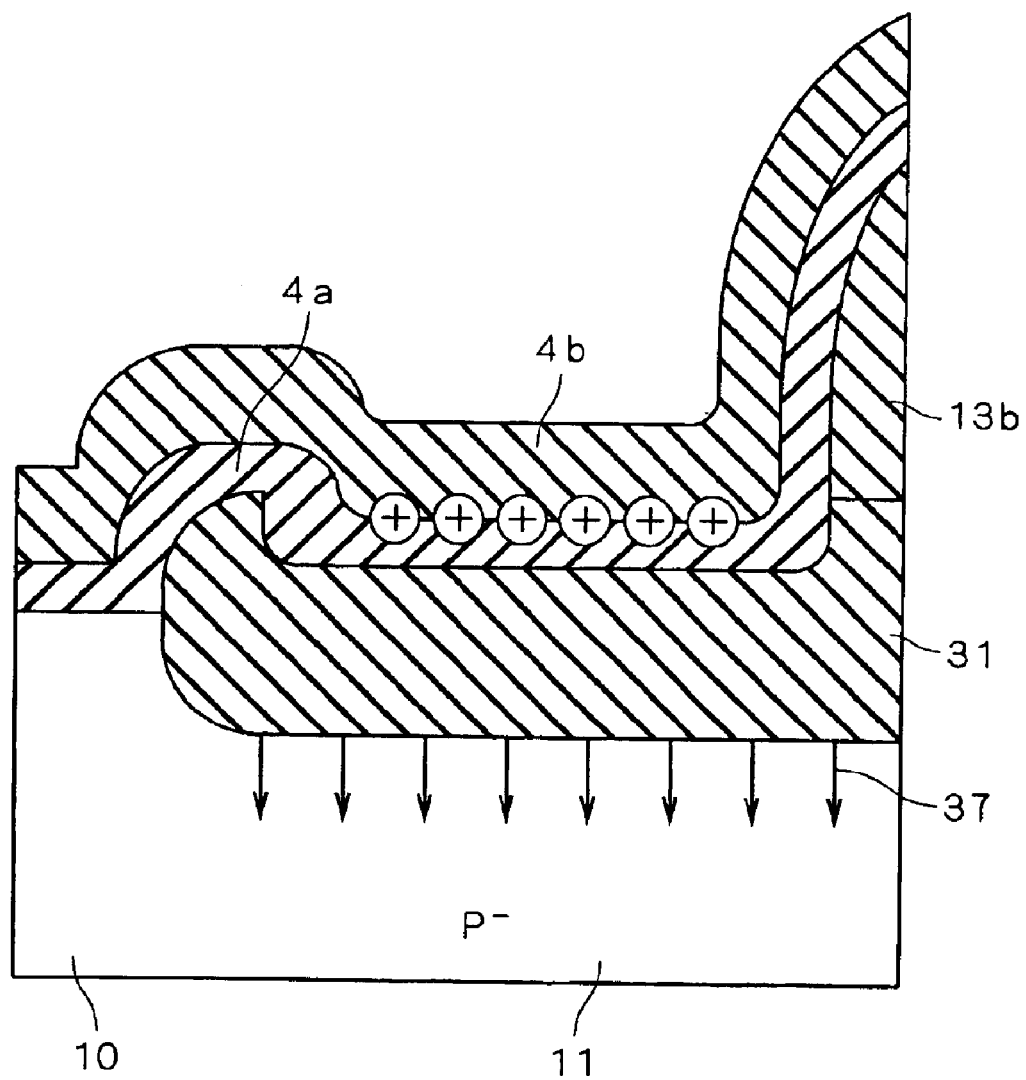
FIG. 13 is an explanatory diagram showing a collapse phenomenon of a partial oxide film.

FIG. 13 is an explanatory diagram showing a collapse phenomenon of the partial oxide film 31. In general, a region of the partial oxide film 31 into which both of N- and P-type impurities are implanted is scraped in advance of the remaining region in wet etching, and hence the thickness of this region is reduced by a collapse phenomenon as shown in FIG. 13. Referring to FIG. 13, an oxide film 4a and a silicon nitride film 4b form an interlayer isolation film 4, and a silicon nitride film 13b forms the side wall 13.

Exemplary wet etching is dilute hydrofluoric acid (HF) treatment or APM (ammonia-hydrogen peroxide mixture) cleaning employing a mixed solution of ammonia ($NH_4OH$), aqueous hydrogen peroxide ($H_2O_2$) and pure water ($H_2O$), and the dilute hydrofluoric acid (HF) treatment is carried out for removing a TEOS oxide film forming the side wall 13 or the like, for example.

Consequently, the effective thickness of the well region 11 is reduced due to extension 37 of a depletion layer, and hence the body resistance is disadvantageously increased. Therefore, the collapse phenomenon is preferably suppressed to the minimum.

Figure 14:
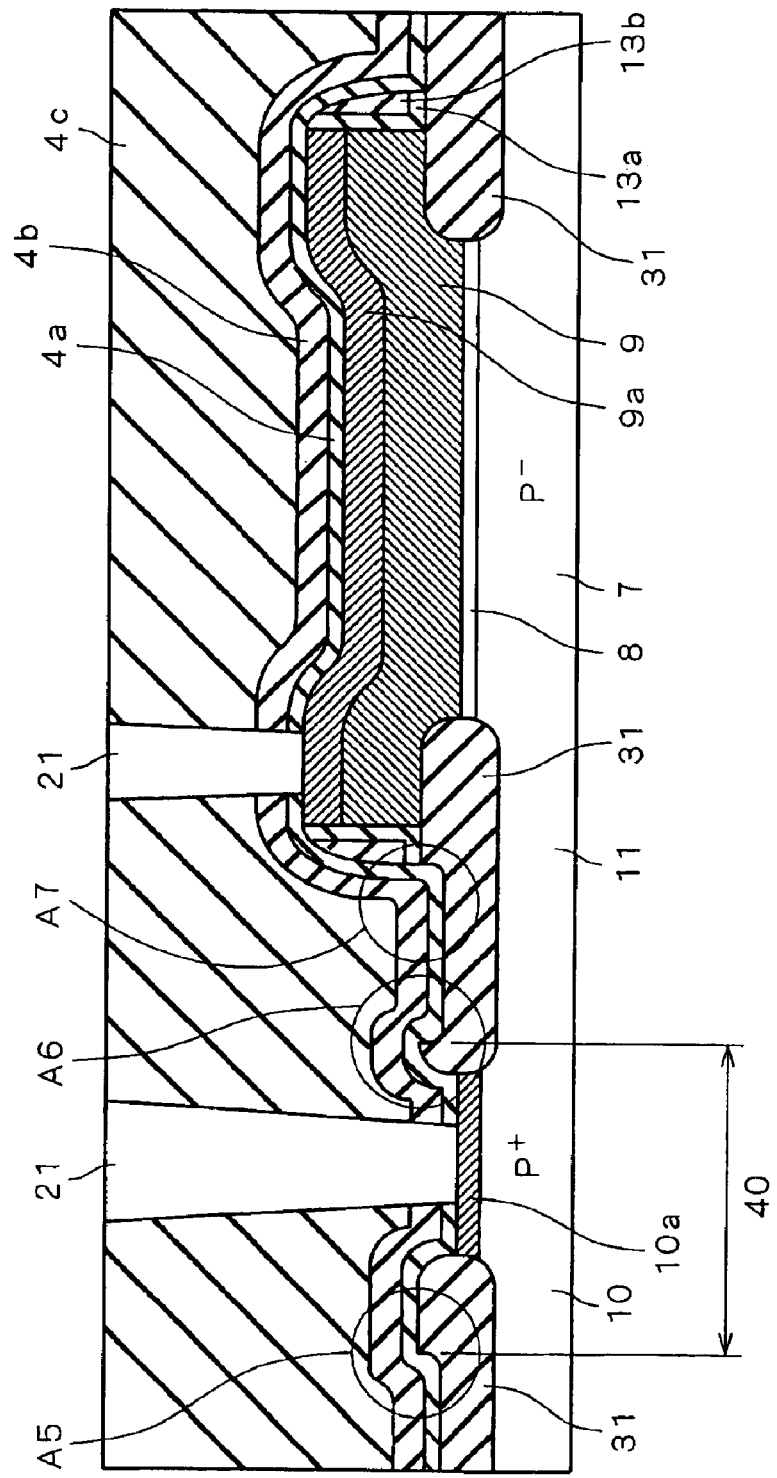
FIG. 14 is a sectional view showing a sectional structure of a semiconductor device having a partially isolated body fixed SOI structure manufactured by a conventional method.
Figure 36:
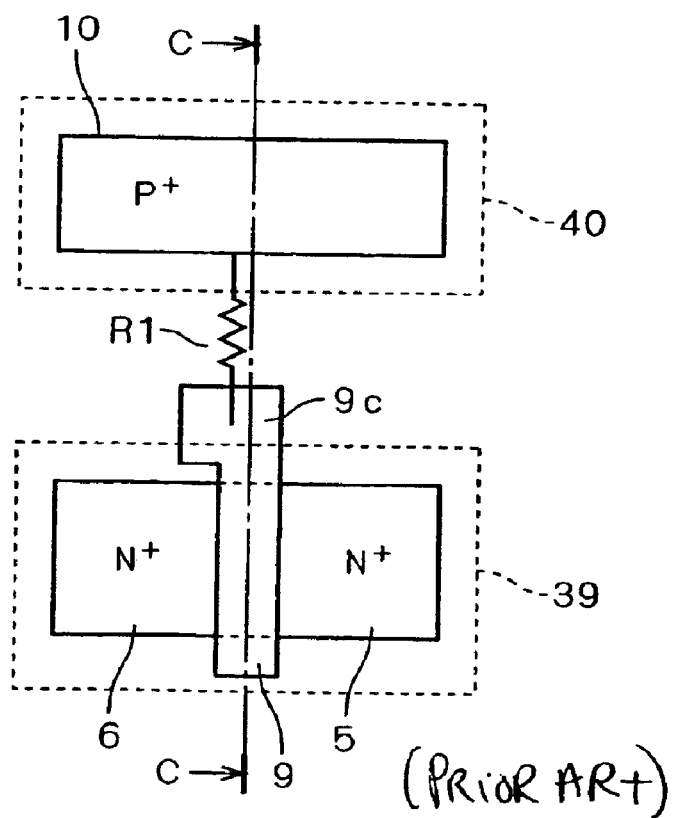
FIG. 36 is a plan view showing a semiconductor device having a partially isolated body fixed SOI structure.

FIG. 14 is a sectional view showing a sectional structure of the semiconductor device having a partially isolated body fixed SOI structure manufactured by the conventional method. The section shown in FIG. 14 is taken along the line C—C in FIG. 36.

As shown in FIG. 14, each side wall 13 is formed by a TEOS oxide film 13a and a silicon nitride film 13b, and the interlayer isolation film 4 is formed by an oxide film 4a, a silicon nitride film 4b and an oxide film 4c.

As shown in FIG. 14, only the N+ block region 40 is masked against implantation of an N-type impurity, and hence the N-type impurity is disadvantageously implanted into most parts of the partial oxide films 31 to cause the aforementioned collapse phenomenon in regions A5 to A7.

Figure 15:
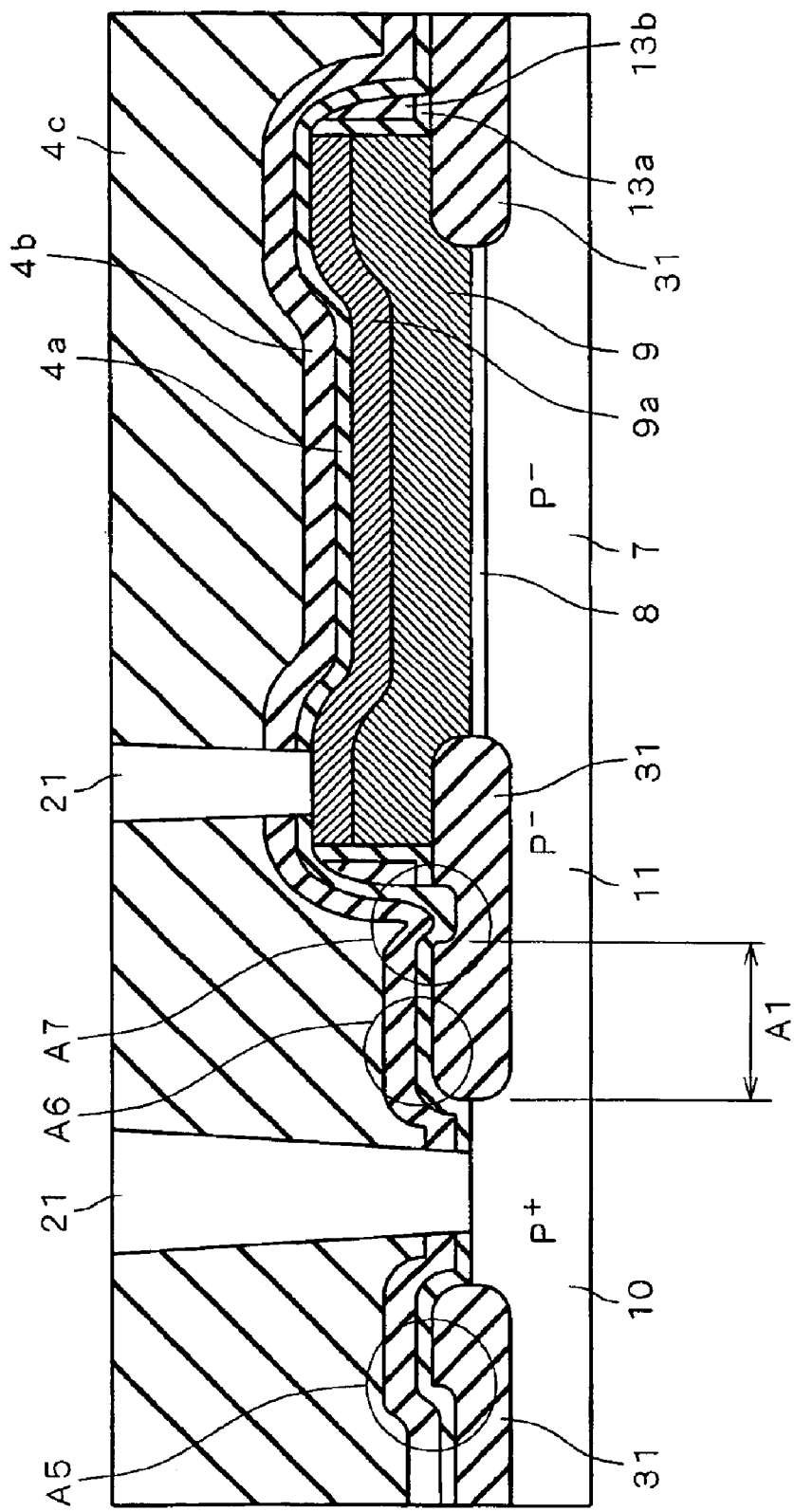
FIG. 15 is a sectional view showing a sectional structure of the semiconductor device having a partially isolated body fixed SOI structure manufactured by the method according to the embodiment 1.

FIG. 15 is a sectional view showing a sectional structure of the semiconductor device having a partially isolated body fixed SOI structure manufactured by the method according to the embodiment 1. The section shown in FIG. 15 is taken along the line C—C in FIG. 10.

As shown in FIG. 15, the N+ block region 41 wider than the N+ block region 40 by the gate-directional extension region 41a is masked against implantation of an N-type impurity, to result in the aforementioned collapse phenomenon in regions A5 and A7, similarly to the prior art. However, the collapse phenomenon can be avoided in a region A6, which is masked by the gate-directional extension region 41a against implantation of the N-type impurity. In other words, the partial oxide film 31 located under the N+ block resist film 51 is an N-type impurity-free region containing no N-type impurity, and hence no collapse phenomenon takes place in the region A6.

Thus, the manufacturing method according to the embodiment 1, which can more suppress the collapse phenomenon than the prior art, can reduce the resistance value of the body resistance.

While FIG. 10 shows the P+ block region 39 and the N+ block region 41 in the NMOS region, an equivalent effect can be attained by forming a P+ block region equivalent to the N+ block region 41 on the (region planned for forming the) body region while forming an N+ block region equivalent to the P+ block region 39 on the (region planned for forming the) source/drain region in the PMOS region.

<Embodiment 2>

Figure 16:
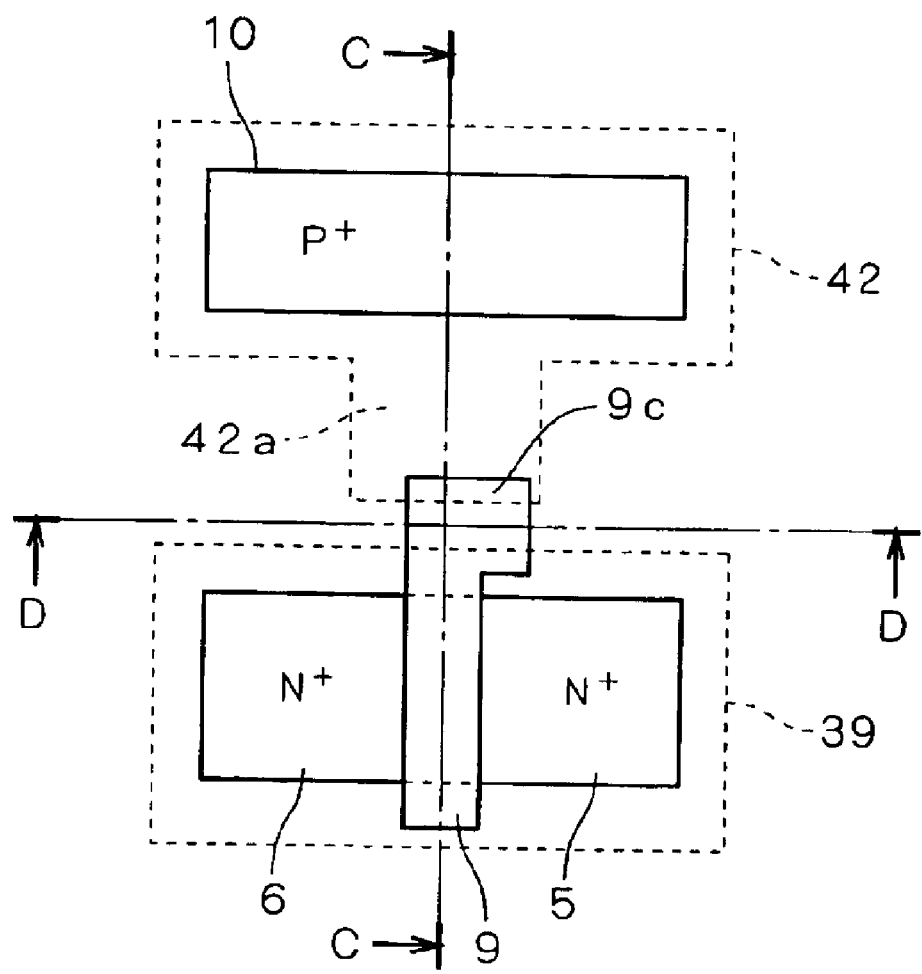
FIG. 16 is a plan view showing a method of manufacturing a semiconductor device having a partially isolated body fixed SOI structure according to an embodiment 2 of the present invention.

FIG. 16 is a plan view showing a method of manufacturing a semiconductor device having a partially isolated body fixed SOI structure according to an embodiment 2 of the present invention.

As shown in FIG. 16, an N+ block region 42 reliably covers a region (planned) for forming a body region 10 and has a gate-directional extension region 42a obtained by extending a partial region on a longitudinal extension of a gate electrode 9 toward a gate contact region 9c to partially overlap with the gate contact region 9c.

A P+ block region 39 indicates a resist film forming region in implantation of the P-type impurity ions 18 shown in FIG. 9, and the N+ block region 42 indicates a resist film forming region in implantation of the N-type impurity ions 17 shown in FIG. 8. The remaining structure of the embodiment 2 is similar to that of the embodiment 1 shown in FIG. 10.

Figure 17:
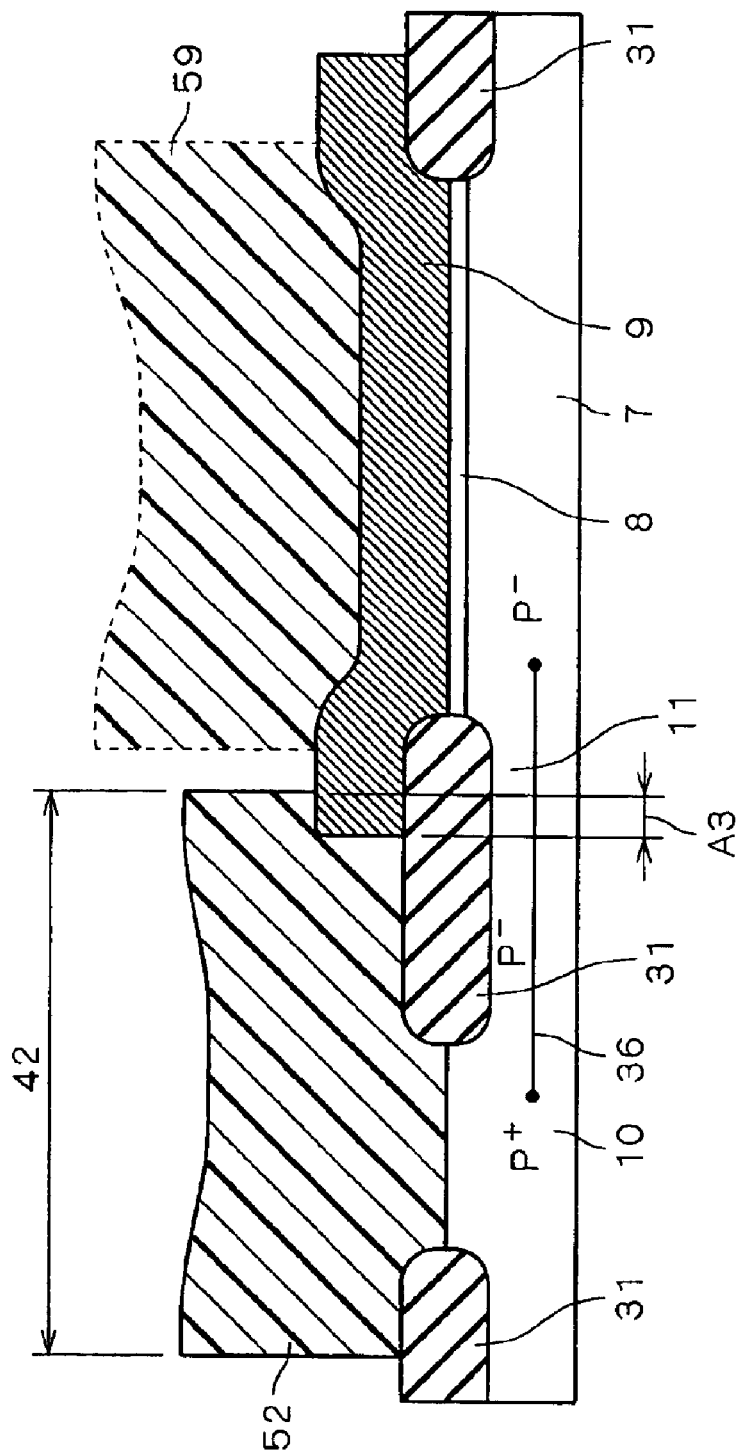
FIG. 17 is a sectional view showing a sectional structure of the semiconductor device according to the embodiment 2 in formation of a block resist film.

FIG. 17 is a sectional view taken along the line C—C in FIG. 16, showing a sectional structure in block resist formation according to the embodiment 2.

As shown in FIG. 17, an N+ block resist film 52 is formed on the N+ block region 42 overlapping with the gate electrode 9 on a region A3. A P+ block resist film 59 is formed on the P+ block region 39.

In a well region 11, a body resistance path 36 on a longitudinal extension of the gate electrode 9 has substantially no high resistance forming region into which both of N- and P-type impurities may be implanted, as shown in FIG. 17. In other words, the well region 11 reaching a channel forming region 7 forming a transistor forming region from the body region 10 defines a P-type impurity region mixed with no N-type impurity.

The gate electrode 9 generally having a thickness of about 200 nm can reliably block implantation of an impurity such as As implanted at 50 keV or P implanted at 40 keV. Therefore, the well region 11 located on the longitudinal extension of the gate electrode 9 is reliably blocked against implantation of the N-type impurity by the N+ block resist film 52 and the gate electrode 9.

Therefore, no N-type impurity is implanted into the well region 11 located on the longitudinal extension of the gate electrode 9, whereby the resistance value of body resistance can be attained and dispersion can be suppressed. According to the embodiment 2, further, the body resistance path 36 has no high resistance forming region, whereby the effect of reducing the body resistance can be attained in excess of the embodiment 1.

Consequently, a precisely controllable semiconductor device having a partially isolated body fixed SOI structure can be obtained without increasing the resistance value of the body resistance.

In addition, the $N^+$ block region 42 is changed from the conventional $N^+$ block region for carrying out the manufacturing method according to the embodiment 2, whereby the number of manufacturing steps is not increased beyond that of the prior art.

Figure 18:
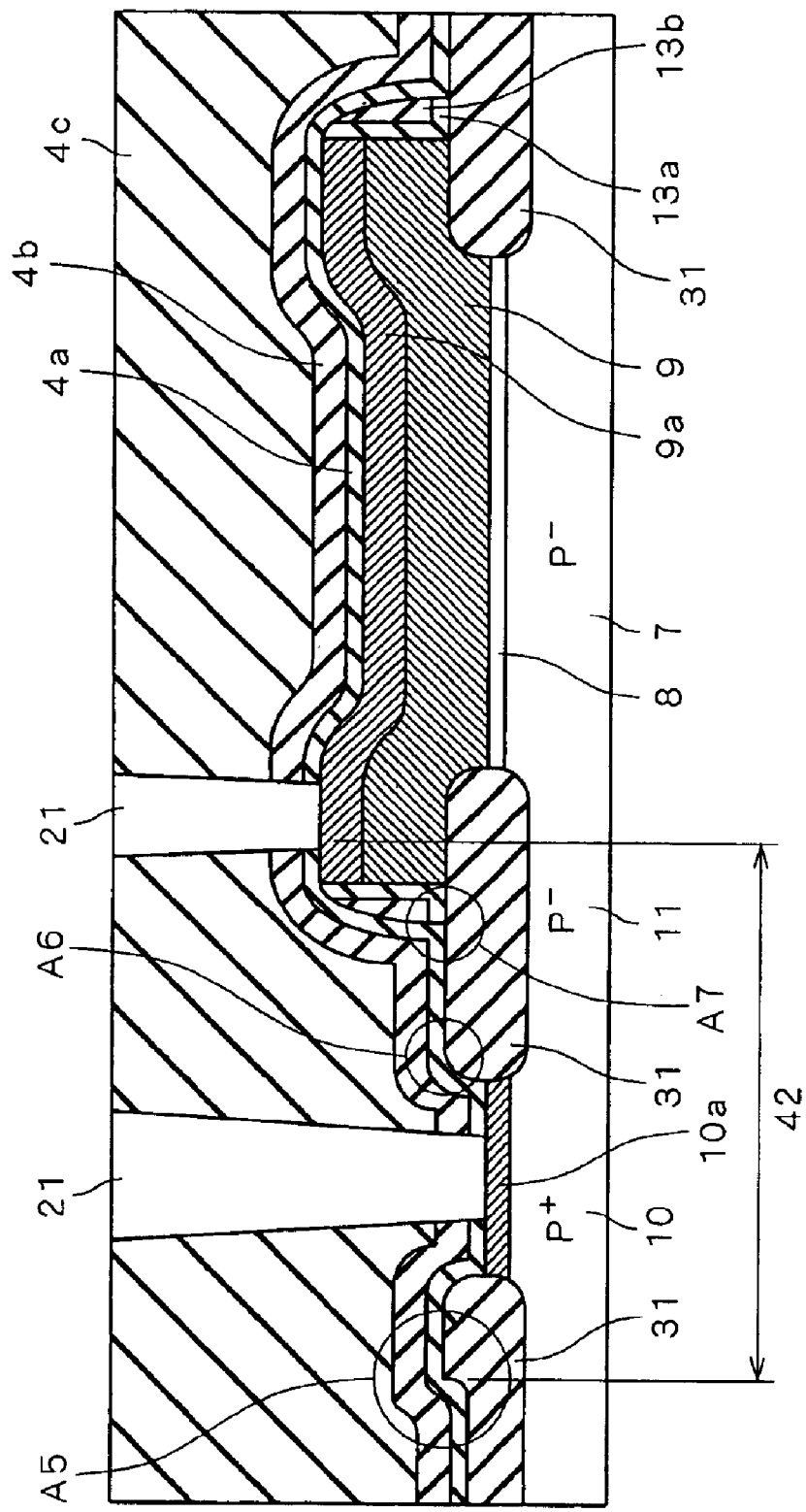

FIG. 18 is a sectional view showing a sectional structure of the semiconductor device having a partially isolated body fixed SOI structure manufactured by the method according to the embodiment 2. The section shown in FIG. 18 is taken along the line C—C in FIG. 16.

As shown in FIG. 18, the $N^+$ block region 42 wider than the $N^+$ block region 40 by the gate-directional extension region 42a and the region located under the gate electrode 9 is masked against implantation of the N-type impurity, and hence a collapse phenomenon takes place in a region A5. However, regions A6 and A7 are masked against implantation of the N-type impurity due to the gate-directional extension region 42a, whereby the collapse phenomenon can be avoided. In other words, the region of a partial oxide film 31 reaching a channel forming region 7 from a body region 10 located under the $N^+$ block resist film 52 and the gate electrode 9 defines an N-type impurity-free region, whereby no collapse phenomenon takes place in the regions A6 and A7.

Thus, the manufacturing method according to the embodiment 2, which can more suppress the collapse phenomenon than the embodiment 1, can further reduce the resistance value of the body resistance.

FIG. 19 is a sectional view showing a sectional structure of the semiconductor device having a partially isolated body fixed SOI structure manufactured by the method according to the embodiment 2. The section shown in FIG. 19 is taken along the line D—D in FIG. 16.

As shown in FIG. 19, a collapse phenomenon takes place in a region A4 of the partial oxide film 31 not masked with the gate electrode 9 and the side walls 13 (13a and 13b).

While FIG. 16 shows the $P^+$ block region 39 and the $N^+$ block region 42 in an NMOS region, a similar effect can be attained by forming equivalent block regions in a PMOS region, similarly to the embodiment 1.

<Embodiment 3>

Figure 20:
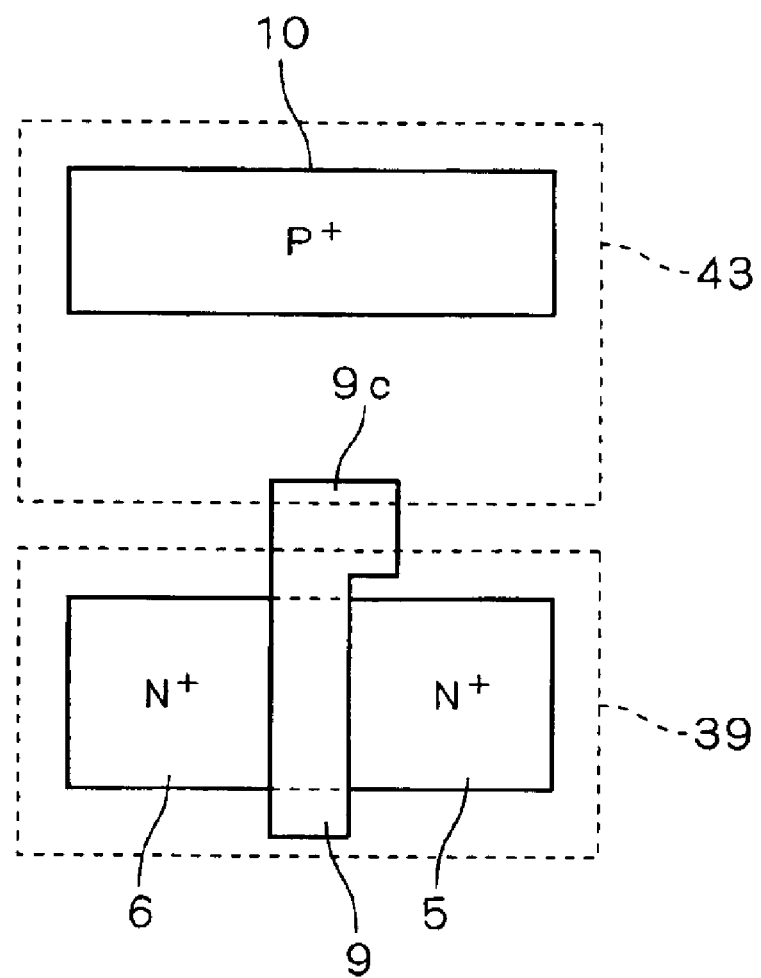
FIG. 20 is a plan view showing a method of manufacturing a semiconductor device having a partially isolated body fixed SOI structure according to an embodiment 3 of the present invention.

FIG. 20 is a plan view showing a method of manufacturing a semiconductor device having a partially isolated body fixed SOI structure according to an embodiment 3 of the present invention.

As shown in FIG. 20, an $N^+$ block region 43 is so provided as to reliably cover a region (planned) for forming a body region 10 and extend the overall area close to a gate electrode 9 toward a gate contact region 9c for partially overlapping with the gate contact region 9c.

A $P^+$ block region 39 indicates a resist film forming region in implantation of the P-type impurity ions 18 shown in FIG. 9, and the $N^+$ block region 43 indicates a resist film forming region in implantation of the N-type impurity ions 17 shown in FIG. 8. The remaining structure of the embodiment 3 is similar to that of the embodiment 2 shown in FIG. 16.

In the manufacturing method according to the embodiment 3, no N-type impurity is implanted into a body resistance path in a well region 11 similarly to the embodiment 2, whereby the resistance value of body resistance can be reduced and dispersion can be suppressed, for attaining a more reliable effect of reducing the body resistance than the embodiment 1.

Consequently, a precisely controllable semiconductor device having a partially isolated body fixed SOI structure can be obtained without increasing the resistance value of the body resistance.

In addition, the $N^+$ block region 43 is changed from the conventional $N^+$ block region for carrying out the manufacturing method according to the embodiment 3, so that the number of manufacturing steps is not increased beyond that of the prior art.

Further, the manufacturing method according to the embodiment 3, which can more suppress a collapse phenomenon than the embodiment 1 for a reason similar to that of the embodiment 2, can further reduce the resistance value of the body resistance.

While FIG. 20 shows the $P^+$ block region 39 and the $N^+$ block region 43 in an NMOS region, a similar effect can be attained by forming equivalent block regions in a PMOS region, similarly to the embodiments 1 and 2.

<Embodiment 4>

Figure 21:
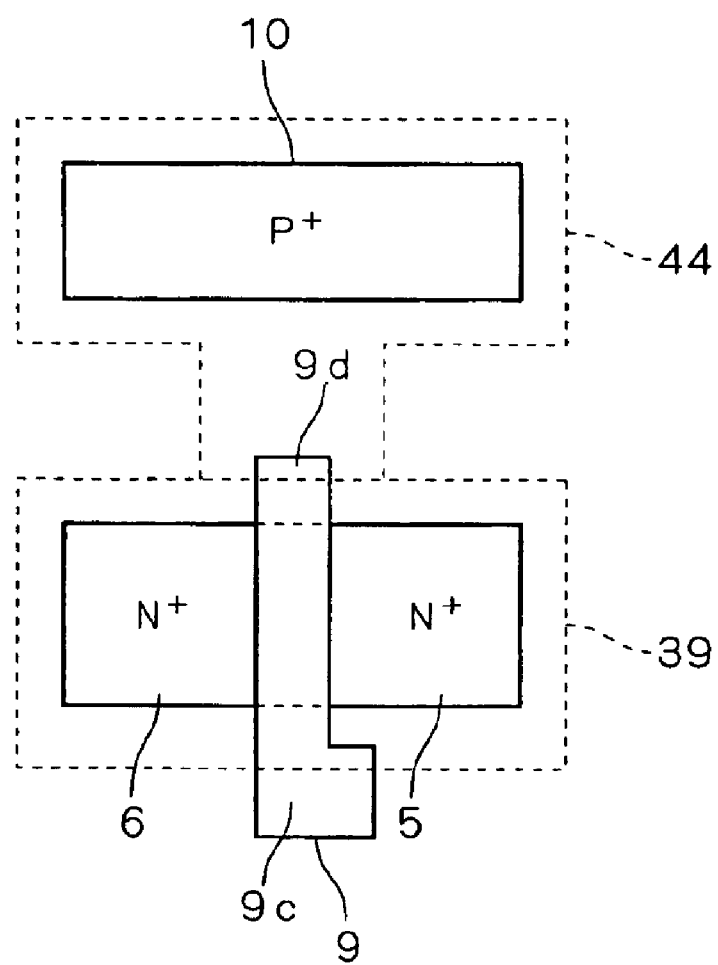
FIG. 21 is a plan view showing a method of manufacturing a semiconductor device having a partially isolated body fixed SOI structure according to an embodiment 4 of the present invention.

FIG. 21 is a plan view showing a method of manufacturing a semiconductor device having a partially isolated body fixed SOI structure according to an embodiment 4 of the present invention.

As shown in FIG. 21, an $N^+$ block region 44 is so provided as to reliably cover a region (planned) for forming a body region 10 and extend the overall area close to a gate electrode 9 toward a gate extension region 9d for partially overlapping with the gate extension region 9d.

A $P^+$ block region 39 indicates a resist film forming region in implantation of the P-type impurity ions 18 shown in FIG. 9, and the $N^+$ block region 44 indicates a resist film forming region in implantation of the N-type impurity ions 17 shown in FIG. 8. The remaining structure of the embodiment 4 is similar to that of the embodiment 2 shown in FIG. 16.

In the manufacturing method according to the embodiment 4, no N-type impurity is implanted into a body resistance path in a well region 11 similarly to the embodiments 2 and 3, whereby the resistance value of body resistance can be reduced and dispersion can be suppressed, for attaining a more reliable effect of reducing the body resistance than the embodiment 1.

Consequently, a precisely controllable semiconductor device having a partially isolated body fixed SOI structure can be obtained without increasing the resistance value of the body resistance.

In addition, the $N^+$ block region 44 is changed from the conventional $N^+$ block region for carrying out the manufacturing method according to the embodiment 4, so that the number of manufacturing steps is not increased beyond that of the prior art.

Further, the manufacturing method according to the embodiment 4, which can more suppress a collapse phenomenon than the embodiment 1 for a reason similar to that of the embodiment 2, can further reduce the resistance value of the body resistance.

While FIG. 21 shows the $P^+$ block region 39 and the $N^+$ block region 44 in an NMOS region, a similar effect can be attained by forming equivalent block regions in a PMOS region, similarly to the embodiments 1 to 3.

<Embodiment 5>

Figure 22:
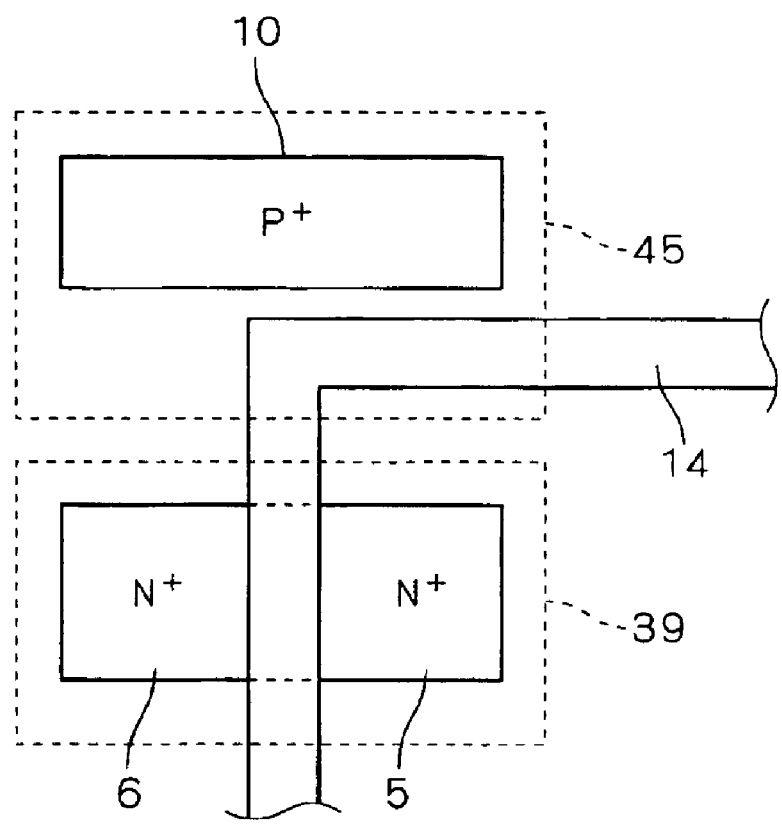
FIG. 22 is a plan view showing a method of manufacturing a semiconductor device having a partially isolated body fixed SOI structure according to an embodiment 5 of the present invention.

FIG. 22 is a plan view showing a method of manufacturing a semiconductor device having a partially isolated body fixed SOI structure according to an embodiment 5 of the present invention.

As shown in FIG. 22, a gate wiring part 14 having functions of a gate electrode and a gate wire is provided according to the embodiment 5 in place of the gate electrode 9 employed in each of the embodiments 1 to 4. The gate wiring part 14 extends from a channel forming region 7 (not shown) between a drain region 5 and a source region 6 toward a body region 10 to be bent on an intermediate portion.

An N$^+$ block region 45 is so provided as to reliably cover a region (planned) for forming a body region 10 and extend the overall region close to a P$^+$ block region 39 toward the gate wiring pat 14 for partially overlapping with the gate wiring part 14.

The P$^+$ block region 39 indicates a resist film forming region in implantation of the P-type impurity ions 18 shown in FIG. 9, and the N$^+$ block region 45 indicates a resist film forming region in implantation of the N-type impurity ions 17 shown in FIG. 8. The remaining structure of the embodiment 5 is similar to that of the embodiment 2 shown in FIG. 16.

In the manufacturing method according to the embodiment 5, no N-type impurity is implanted into a body resistance path in a well region 11 similarly to the embodiments 2 to 4, whereby the resistance value of body resistance can be reduced and dispersion can be suppressed, for attaining a more reliable effect of reducing the body resistance than the embodiment 1.

Consequently, a precisely controllable semiconductor device having a partially isolated body fixed SOI structure can be obtained without increasing the resistance value of the body resistance.

In addition, the N$^+$ block region 45 is changed from the conventional N$^+$ block region for carrying out the manufacturing method according to the embodiment 5, so that the number of manufacturing steps is not increased beyond that of the prior art.

Further, the manufacturing method according to the embodiment 5, which can more suppress a collapse phenomenon than the embodiment 1 for a reason similar to that of the embodiment 2, can further reduce the resistance value of the body resistance.

While FIG. 22 shows the P$^+$ block region 39 and the N$^+$ block region 45 in an NMOS region, a similar effect can be attained by forming equivalent block regions in a PMOS region, similarly to the embodiments 1 to 4.

<Embodiment 6>

Figure 23:
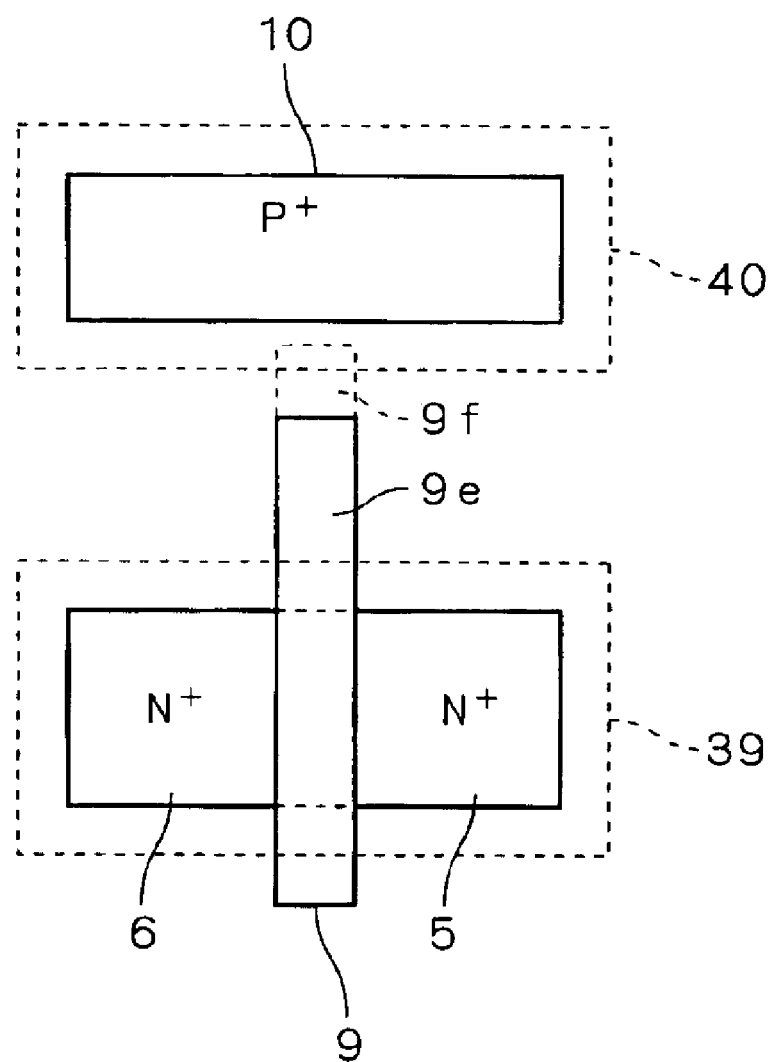
FIG. 23 is a plan view showing a method of manufacturing a semiconductor device having a partially isolated body fixed SOI structure according to an embodiment 6 of the present invention.

FIG. 23 is a plan view showing a method of manufacturing a semiconductor device having a partially isolated body fixed SOI structure according to an embodiment 6 of the present invention.

As shown in FIG. 23, an N$^+$ block region 40 is formed in the minimum necessary size for forming a region (planned) for forming a body region 10.

On the other hand, a gate electrode 9 has a gate extension region 9e remarkably extending toward the body region 10. The remaining structure of the embodiment 6 is similar to that of the embodiment 1 shown in FIG. 10.

In the manufacturing method according to the embodiment 6, no N-type impurity is implanted into a well region 11 located under the gate extension region 9e similarly to the embodiment 1, whereby the resistance value of body resistance can be reduced and dispersion can be suppressed for attaining the effect of reducing the body resistance similarly to the embodiment 1.

Consequently, a precisely controllable semiconductor device having a partially isolated body fixed SOI structure can be obtained without increasing the resistance value of the body resistance.

In addition, the N$^+$ block region 40 is not changed from the conventional N$^+$ block region, and hence the number of steps is not increased beyond that of the prior art by carrying out the manufacturing method according to the embodiment 6.

In the manufacturing method according to the embodiment 6, further, a partial oxide film 31 located under the gate extension region 9e defines an impurity-free region so that a collapse phenomenon can be suppressed similarly to the embodiment 1, whereby the resistance value of the body resistance can be further reduced.

Another gate extension region 9f is formed to partially overlap with the N$^+$ block region 40 as shown by one-chain dot lines in FIG. 23 so that no N-type impurity is implanted into a body resistance path in the well region 11 similarly to the embodiments 2 to 4, whereby the effect of reducing the body resistance can be attained in excess of the embodiment 1.

While FIG. 23 shows the gate extension regions 9e and 9f in an NMOS region, an equivalent effect can be attained by forming a gate electrode having equivalent gate extension regions on a PMOS region.

The thickness of the partial oxide film 31 located under the gate extension regions 9e and 9f is not reduced by wet etching performed after formation of the gate electrode 9 due to the presence of the gate extension regions 9e and 9f, whereby the degree of fluctuation of body resistance resulting from influence exerted by a gate voltage on a well region forming a body resistance path 36 can be reduced.

<Embodiment 7>

Each of the embodiments 1 to 6 employs a shielding preferential mask of a resist film formed on a block region mainly including a source/drain region and a body region, in order to prevent impurity implantation.

The shielding preferential mask is generally used mainly for the purpose of suppressing the resist film forming area to the minimum and preventing a gate oxide film etc. from static damage in impurity ion implantation.

Methods of designing the shielding preferential mask are classified into the following methods ① and ②.

① The region for preventing impurity implantation is designed by CAD or the like, for exposing a positive resist film with a mask (normal mask) employing this region as a shielding part on the mask as such.

② The region for preventing impurity implantation is designed by CAD or the like, for exposing a negative resist film with a mask (anti-mask) employing a region other than this region as a shielding part.

However, the ion implantation technique has recently been so improved that the aforementioned static damage is hardly caused due to treatment such as electron showering for compensating for a charge-up phenomenon in ion implantation.

Accordingly, a manufacturing method according to an embodiment 7 of the present invention employs an opening preferential mask provided with an opening mainly along a region to be subjected to impurity implantation, although the area of a resist film is increased.

Methods of designing the opening preferential mask are classified into the following methods ③ and ④.

③ A region to be subjected to impurity implantation is designed by CAD or the like, and thereafter an anti-mask is prepared for exposing a positive resist film.

④ The region to be subjected to impurity implantation is designed by CAD or the like, and thereafter a normal mask is prepared for exposing a negative resist film.

Figure 24:
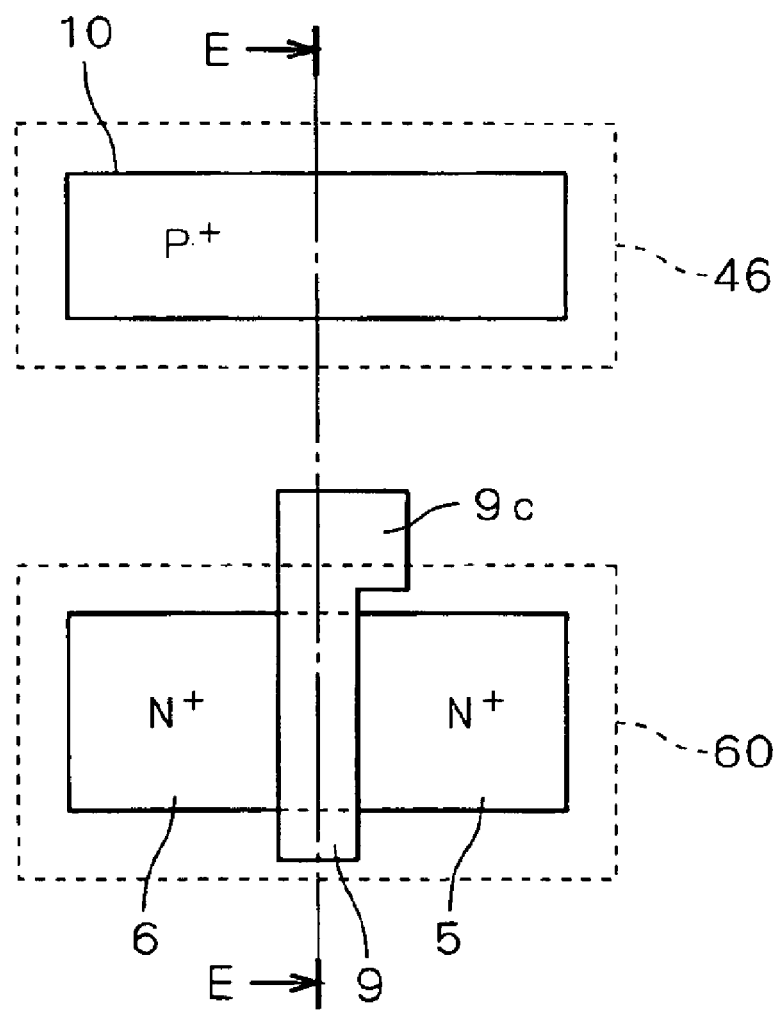
FIG. 24 is a plan view showing a method of manufacturing a semiconductor device having a partially isolated body fixed SOI structure according to an embodiment 7 of the present invention.

FIG. 24 is a plan view showing the method of manufacturing a semiconductor device having a partially isolated body fixed SOI structure according to the embodiment 7 of the present invention.

As shown in FIG. 24, an $N^+$ implantation region 60 is provided on the minimum necessary region for implanting an N-type impurity into source/drain regions 5 and 6, and a $P^+$ implantation region 46 is provided on the minimum necessary region for implanting a P-type impurity into a body region 10.

The $P^+$ implantation region 46 indicates a resist film opening region in implantation of the P-type impurity ions 18 shown in FIG. 9, and the $N^+$ implantation region 60 indicates a resist film opening region in implantation of the N-type impurity ions 17 shown in FIG. 8.

Figure 25:
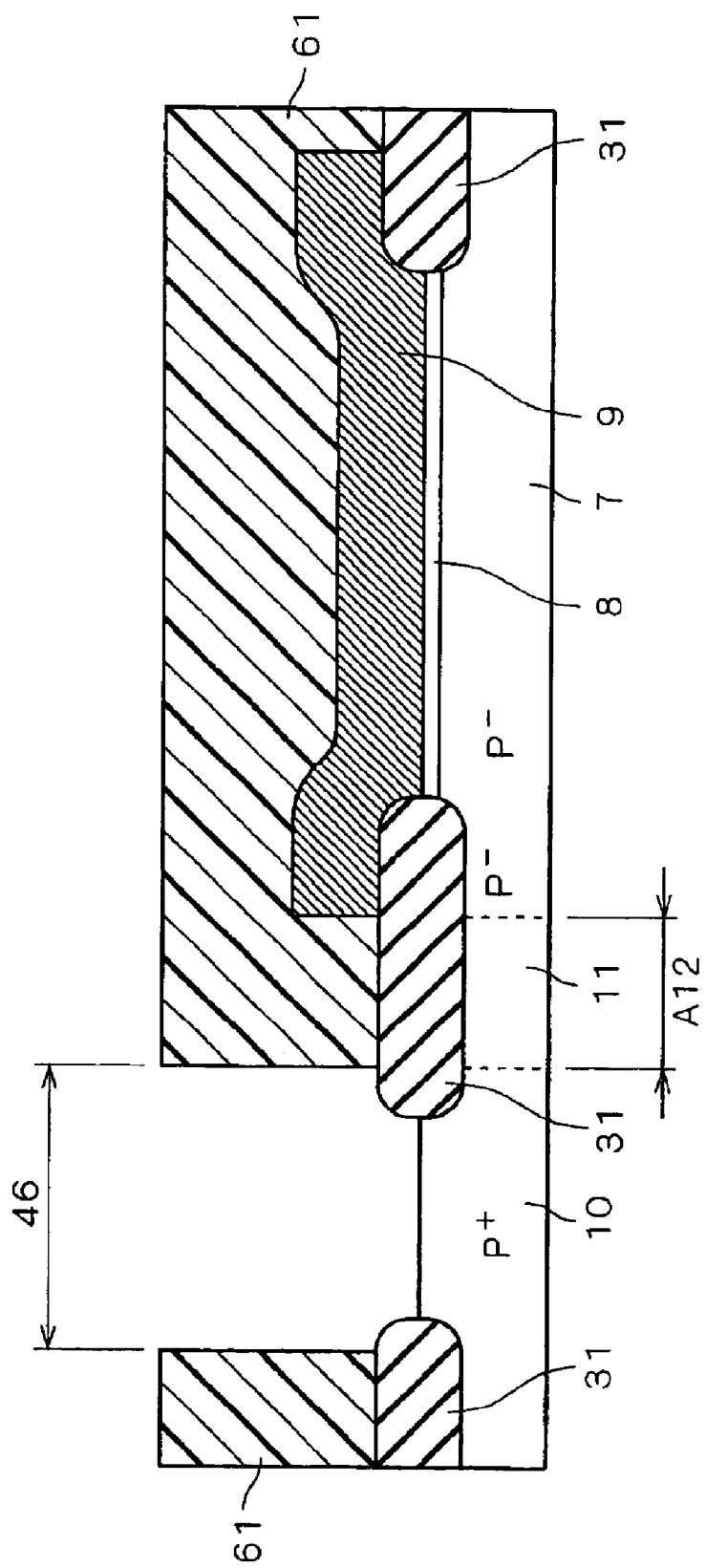
FIG. 25 is a sectional view showing a sectional structure of the semiconductor device according to the embodiment 7 in formation of a P$^+$ implantation resist film.

FIG. 25 is a sectional view taken along the line E—E in FIG. 24, showing a sectional structure in formation of a $P^+$ implantation resist film 61 according to the embodiment 7.

As shown in FIG. 25, the $P^+$ implantation resist film 61 is formed to open only the $P^+$ implantation region 46.

Figure 26:
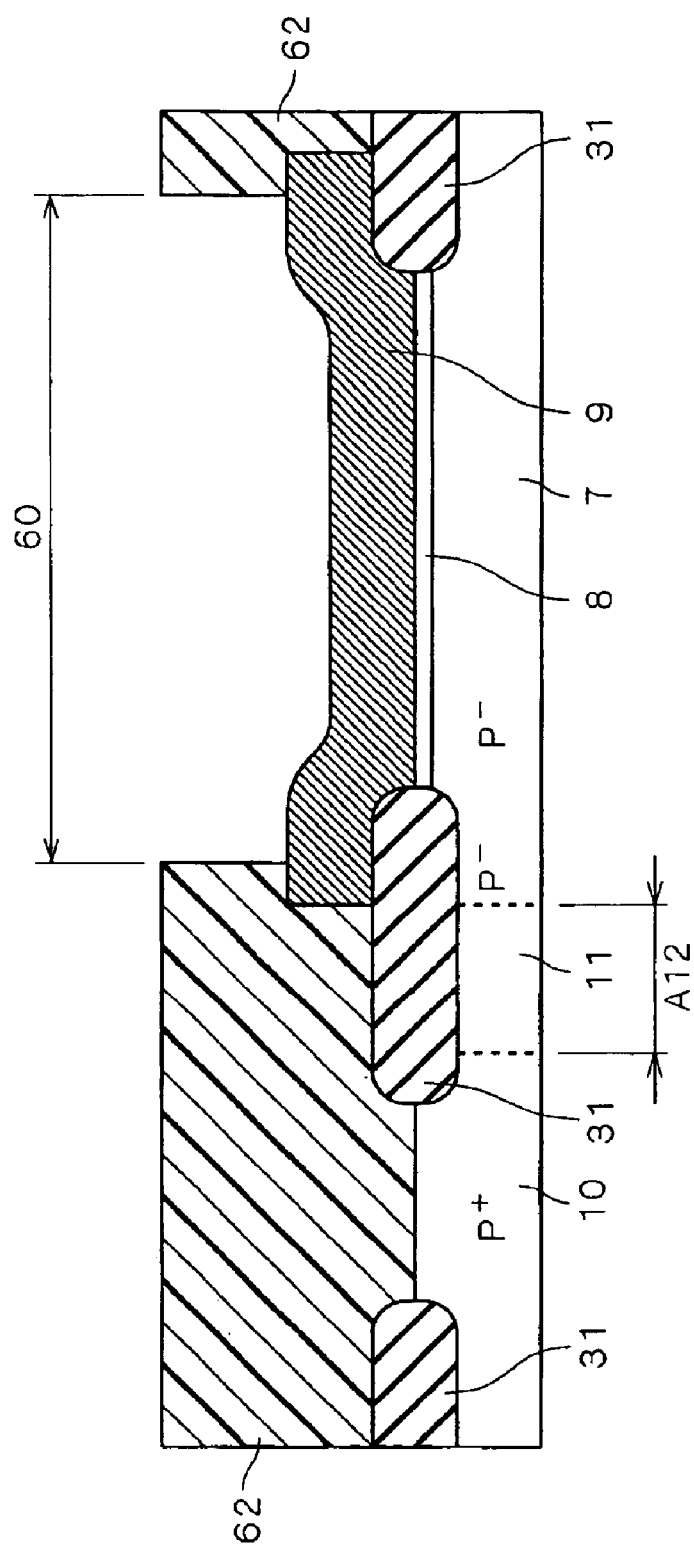
FIG. 26 is a sectional view showing a sectional structure of the semiconductor device according to the embodiment 7 in formation of an N$^+$ implantation resist film.

FIG. 26 is a sectional view taken along the line E—E in FIG. 24, showing a sectional structure in formation of an $N^+$ implantation resist film 62 according to the embodiment 7.

As shown in FIG. 26, the $N^+$ implantation resist film 62 is formed to open only the $N^+$ implantation region 60.

The $P^+$ implantation resist film 61 is provided in the step shown in FIG. 9, and the $N^+$ implantation resist film 62 is provided in the step shown in FIG. 8.

As shown in FIGS. 25 and 26, most part of a well region 11 masked with the $P^+$ implantation resist film 61 and the $N^+$ implantation resist film 62 is not subjected to implantation of P- and N-type impurities, whereby the resistance value of body resistance can be reduced and dispersion can be suppressed. Consequently, a precisely controllable semiconductor device having a partially isolated body fixed SOI structure can be obtained without increasing the resistance value of the body resistance.

In addition, the shielding preferential mask is changed to the opening preferential mask for carrying out the manufacturing method according to the embodiment 7, whereby the number of manufacturing steps is not increased beyond that of the prior art.

Further, most part (corresponding to a region A12) of a partial oxide film 31 is not subjected to implantation of N- and P-type impurities, whereby a collapse phenomenon is hardly caused in the partial oxide film 31.

Thus, the manufacturing method according to the embodiment 7 can further suppress the collapse phenomenon and reduce the resistance value of the body resistance.

<Embodiment 8>

Figure 27:
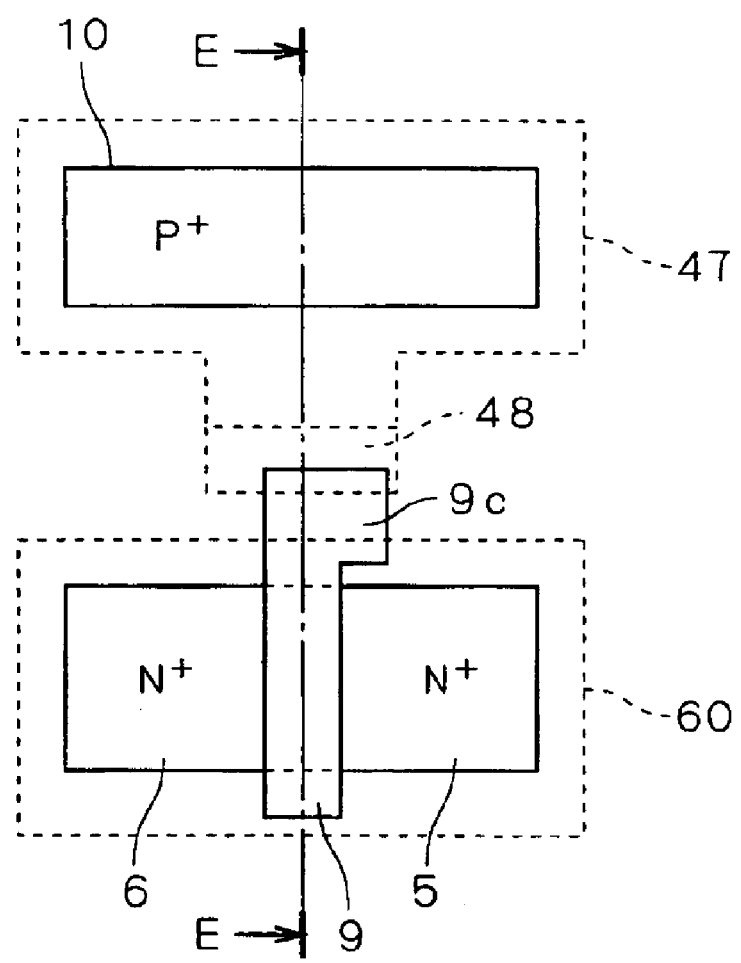
FIG. 27 is a plan view showing a method of manufacturing a semiconductor device having a partially isolated body fixed SOI structure according to an embodiment 8 of the present invention.

FIG. 27 is a plan view showing a method of manufacturing a semiconductor device having a partially isolated body fixed SOI structure according to an embodiment 8 of the present invention.

As shown in FIG. 27, a partial region located on a longitudinal extension of a gate electrode 9 is extended toward a gate contact region 9c to form a $P^+$ implantation region 47 in addition to the minimum necessary region for implanting a P-type impurity into a body region 10.

The $P^+$ implantation region 47 indicates a resist film opening region in implantation of the P-type impurity ions 18 shown in FIG. 9, and an $N^+$ implantation region 60 indicates a resist film opening region in implantation of the N-type impurity ions 17 shown in FIG. 8.

Figure 28:
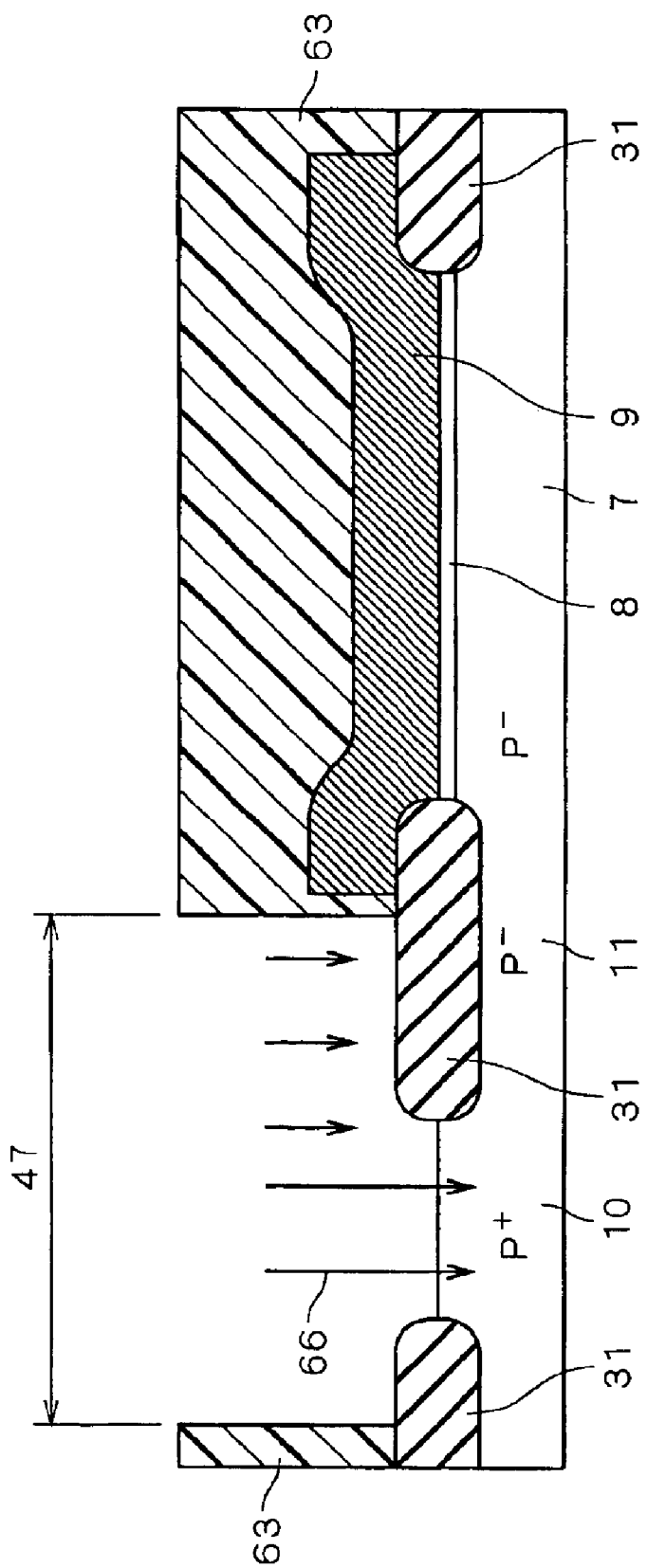
FIG. 28 is a sectional view showing a sectional structure of the semiconductor device according to the embodiment 8 in formation of a P$^+$ implantation resist film.

FIG. 28 is a sectional view taken along the line E—E in FIG. 27, showing a sectional structure in formation of a $P^+$ implantation resist film 63.

As shown in FIG. 28, the $P^+$ implantation resist film 63 is formed to open only the $P^+$ implantation region 47. The $P^+$ implantation resist film 63 is formed in the step shown in FIG. 9. A sectional structure in formation of an $N^+$ implantation resist film 62 is similar to that of the embodiment 7 shown in FIG. 26.

As shown in FIG. 28, most part of a well region 11 masked with the $P^+$ implantation resist film 63 is not subjected to implantation of an N-type impurity, whereby the resistance value of body resistance can be reduced and dispersion can be suppressed.

As shown in FIG. 28, further, the P-type impurity concentration of the well region 11 can be improved for positively reducing the resistance value of the body resistance by positively implanting P-type impurity ions 66 into the well region 11 located under a partial oxide film 31.

Consequently, a precisely controllable semiconductor device having a partially isolated body fixed SOI structure can be obtained without increasing the resistance value of the body resistance.

In addition, the shielding preferential mask is changed to the opening preferential mask for carrying out the manufacturing method according to the embodiment 8, whereby the number of manufacturing steps is not increased beyond that of the prior art.

Further, no N-type impurity is implanted into most part of the partial oxide film 31 due to the $N^+$ implantation resist film 62. While a P-type impurity is implanted into most part of the partial oxide film 31, the resistance value of body resistance can be remarkably reduced due to implantation of the P-type impurity into the well region 11, despite a collapse phenomenon resulting from implantation of the P-type impurity into most part of the partial oxide film 31.

According to the embodiment 8, the $P^+$ implantation region 47 is formed larger than the $P^+$ implantation region 46 according to the embodiment 7, whereby a resist film forming area can be reduced as compared with the embodiment 7.

Another $P^+$ implantation region 48 may be formed to partially overlap with a gate contact region 9c, as shown by one-chain dot lines in FIG. 27. In this case, the resistance value of the body resistance can be further reduced.

<Embodiment 9>

Figure 29:
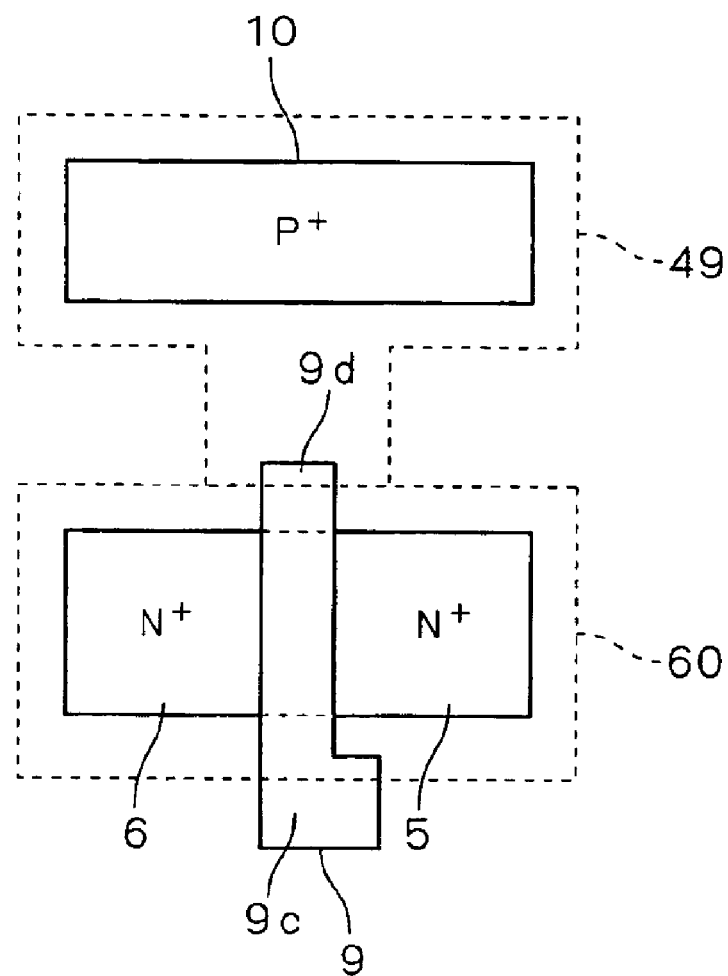
FIG. 29 is a plan view showing a method of manufacturing a semiconductor device having a partially isolated body fixed SOI structure according to an embodiment 9 of the present invention.

FIG. 29 is a plan view showing a method of manufacturing a semiconductor device having a partially isolated body fixed SOI structure according to an embodiment 9 of the present invention.

As shown in FIG. 29, a partial region located on a longitudinal extension of a gate electrode 9 is extended toward a gate extension region 9d for forming a $P^+$ implantation region 49 partially overlapping with the gate extension region 9d in addition to the minimum necessary region for implanting a P-type impurity into a body region 10.

The $P^+$ implantation region 49 indicates a resist film opening region in implantation of the P-type impurity ions 18 shown in FIG. 9, and an $N^+$ implantation region 60 indicates a resist film opening region in implantation of the N-type impurity ions 17 shown in FIG. 8.

In the manufacturing method according to the embodiment 9, a precisely controllable semiconductor device having a partially isolated body fixed SOI structure can be obtained without increasing the resistance value of body resistance due to an effect similar to that of the embodiment 8.

In addition, the number of manufacturing steps is not increased beyond that of the prior art, similarly to the manufacturing method according to the embodiment 8.

According to the embodiment 9, the P$^+$ implantation region 49 is formed larger than the P$^+$ implantation region 46 according to the embodiment 7, whereby a resist film forming area can be reduced as compared with the embodiment 7.

<Embodiment 10>

Figure 30:
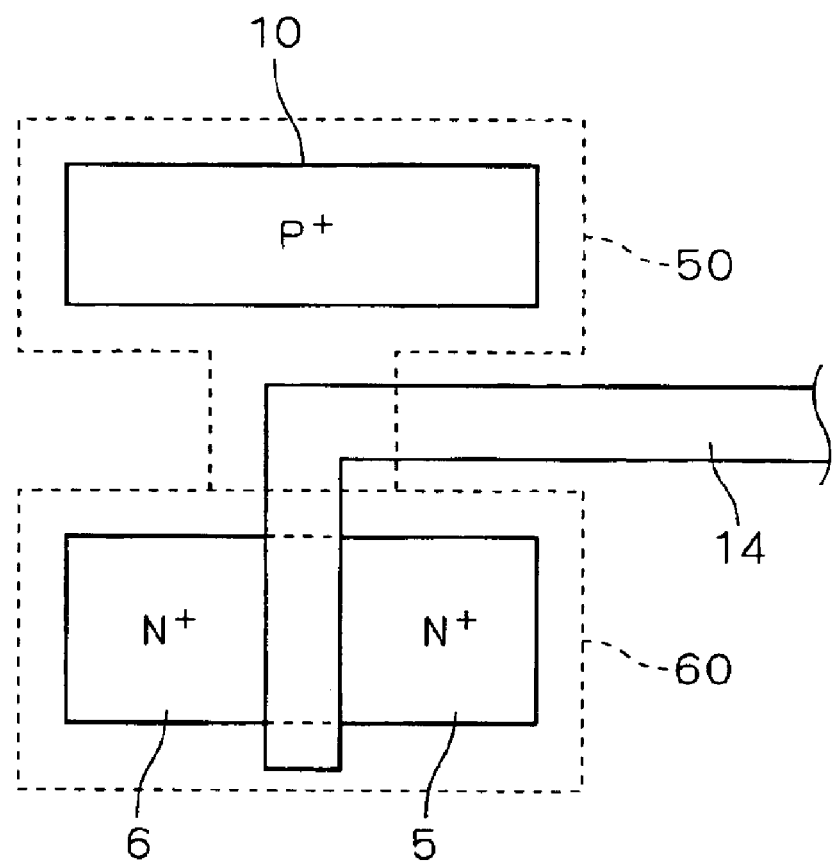
FIG. 30 is a plan view showing a method of manufacturing a semiconductor device having a partially isolated body fixed SOI structure according to an embodiment 10 of the present invention.
Figure 33:
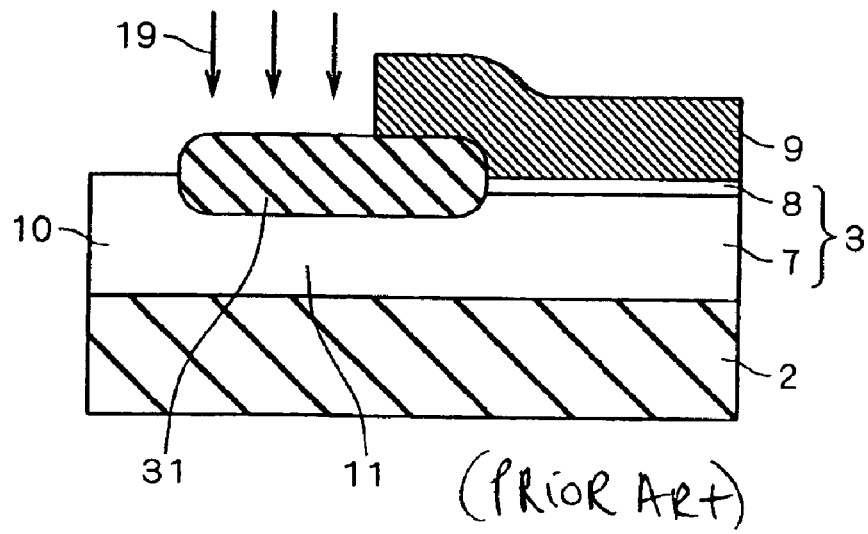
FIG. 33 is a sectional view for illustrating a problem in a conventional partially isolated body fixed SOI structure.
Figure 34:
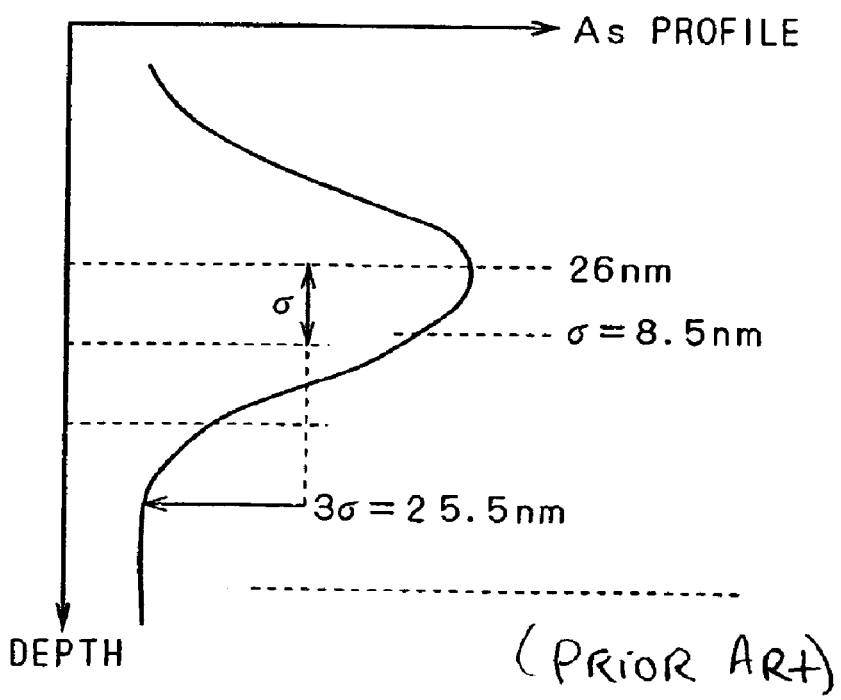
Figure 35:
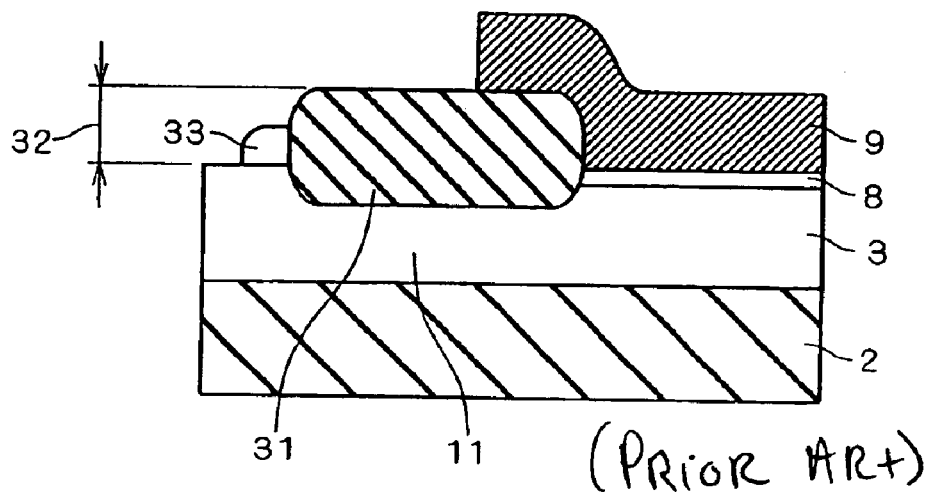
FIG. 35 is a sectional view for illustrating a problem caused by an isolation step of a partial oxide film.

FIG. 30 is a plan view showing a method of manufacturing a semiconductor device having a partially isolated body fixed SOI structure according to an embodiment 10 of the present invention.

As shown in FIG. 30, a gate wiring part 14 having functions of a gate electrode and a gate wire is provided according to the embodiment 10 in place of the gate electrode 9 similarly to the embodiment 5, and the gate wiring part 14 extends from a channel forming region 7 (not shown) between a drain region 5 and a source region 6 toward a body region 10 to be bent on an intermediate portion.

On the other hand, a partial region on the side of an N$^+$ implantation region 60 is extended toward the gate wiring part 14 for forming a P$^+$ implantation region 50 to partially overlap with the gate wiring part 14 in addition to the minimum necessary region for implanting a P-type impurity into the body region 10.

The P$^+$ implantation region 50 indicates a resist film opening region in implantation of the P-type impurity ions 18 shown in FIG. 9, and the N$^+$ implantation region 60 indicates a resist film opening region in implantation of the N-type impurity ions 17 shown in FIG. 8.

In the manufacturing method according to the embodiment 10, a precisely controllable semiconductor device having a partially isolated body fixed SOI structure can be obtained without increasing the resistance value of body resistance due to an effect similar to that of the embodiment 8.

In addition, the number of manufacturing steps is not increased beyond that of the prior art, similarly to the manufacturing method according to the embodiment 8.

According to the embodiment 10, the P$^+$ implantation region 50 is formed larger than the P$^+$ implantation region 46 according to the embodiment 7, whereby a resist film forming area can be reduced as compared with the embodiment 7.

<Embodiment 11>

FIG. 31 is a plan view showing a method of manufacturing a semiconductor device having a partially isolated body fixed SOI structure according to an embodiment 11 of the present invention.

As shown in FIG. 31, an N$^+$ implantation region 60 is provided on the minimum necessary region for implanting an N-type impurity into source/drain regions 5 and 6, and a P$^+$ implantation region 46 is provided on the minimum necessary region for implanting a P-type impurity into a body region 10.

On the other hand, a gate electrode 9 has a gate extension region 9e formed to remarkably extend toward the body region 10. The remaining structure of the embodiment 11 is similar to that of the embodiment 7 shown in FIG. 24.

In the manufacturing method according to the embodiment 11, a precisely controllable semiconductor device having a partially isolated body fixed SOI structure can be obtained without increasing the resistance value of body resistance due to an effect similar to that of the embodiment 7.

In addition, the number of manufacturing steps is not increased beyond that of the prior art, similarly to the manufacturing method according to the embodiment 7.

Another gate extension region 9f may be formed to partially overlap with the P$^+$ implantation region 46, as shown by one-chain dot lines in FIG. 31.

According to this method, reduction of the thickness of a partial oxide film 31 can be prevented in the overlapping portions of the gate extension region 9f and the P$^+$ implantation region 46, for stabilizing body resistance at a low value.

Also when the gate extension region 9e is formed, the thickness of the partial oxide film 31 located under the gate extension region 9e is not reduced by wet etching performed after formation of the gate electrode 9, whereby the degree of fluctuation of the body resistance due to influence exerted by a gate voltage on a well region forming a body resistance path 36 can be reduced.

<Embodiment 12>

FIG. 32 is a plan view showing a method of manufacturing a semiconductor device having a partially isolated body fixed SOI structure according to an embodiment 12 of the present invention.

As shown in FIG. 32, an N$^+$ implantation region 60 is provided on the minimum necessary region for implanting an N-type impurity into source/drain regions 5 and 6, while a partial region located on a longitudinal extension of a gate electrode 9 is extended toward a gate contact region 9c for forming a P$^+$ implantation region 47 in addition to the minimum necessary region for implanting a P-type impurity into a body region 10.

Further, a dummy N$^+$ implantation region 71 is provided on the minimum necessary region for implanting an N-type impurity into a P$^+$ dummy region 73, and a dummy P$^+$ implantation region 72 is provided on the minimum necessary region for implanting a P-type impurity into an N$^+$ dummy region 74.

The N$^+$ implantation region 60 and the dummy N$^+$ implantation region 71 indicate open regions of a first resist film in implantation of the N-type impurity ions 17 shown in FIG. 8, while the P$^+$ implantation region 47 and the dummy P$^+$ implantation region 72 indicate open regions of a second resist film in implantation of the P-type impurity ions 18 shown in FIG. 9.

In the manufacturing method according to the embodiment 12, a precisely controllable semiconductor device having a partially isolated body fixed SOI structure can be obtained without increasing the resistance value of body resistance due to an effect similar to that of the embodiment 7.

In addition, the number of manufacturing steps is not increased beyond that of the prior art, similarly to the manufacturing method according to the embodiment 7.

Further, a resist film forming area can be further reduced due to the dummy N$^+$ implantation region 71 and the dummy P$^+$ implantation region 72. The possibility of statically damaging a gate oxide film 8 etc. by a charge-up phenomenon can be more suppressed than the embodiments 7 to 11.

Further, the dummy N$^+$ implantation region 71 and the dummy P$^+$ implantation region 72, which may be automatically rectangularly formed similarly to a formation rule for the P$^+$ dummy region 73 and the N$^+$ dummy region 74 (formed for homogenizing pattern density for CMP, for example), can be relatively readily designed.

While the dummy N$^+$ implantation region 71 and the dummy P$^+$ implantation region 72 are separately provided for the first and second resist films in the example shown in FIG. 32, the dummy implantation regions may alternatively be provided on the same position in the same shape between the first and second resist films, to be shared as a dummy N$^+$P$^+$ implantation region.

If both of N- and P-type impurities are implanted into this dummy region, inconvenience such as separation of a silicide region may take place. Therefore, the dummy N⁺ implantation region 71 and the dummy P⁺ implantation region 72 are preferably separately provided without overlapping with each other as shown in FIG. 32, so that only one of the N- and P-type impurities is implanted into each dummy region.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising steps of:
   (a) preparing an SOI substrate formed by a semiconductor substrate <1>, an embedded insulating layer <2> and an SOI layer <3>;
   (b) selectively forming on isolation film <31> in an upper layer part of said SOI layer while forming a first conductivity type semiconductor region <11, 12> in a lower layer part of said isolation film so that said isolation film separates said SOI layer into a plurality of element forming regions and at least one said element forming region has a first conductivity type and is formed in contact with said semiconductor region among said plurality of element forming regions;
   (c) selectively forming a second conductivity type active region <5, 6> on the surface of said at least one element forming region; and
   (d) forming a first conductivity type body region <10> capable of being externally fixed in electric potential in said SOI layer to be in contact with said semiconductor region, wherein
   said step (c) is carried out for forming said active region by setting a block region <41 to 45> including said body region and a partial region of said isolation film to a region inhibiting introduction of an impurity of said second conductivity type and introducing said impurity of said second conductivity type into said SOI layer.

2. The method of manufacturing a semiconductor device according to claim 1, wherein
   said step (c) includes a step of introducing an impurity of said second conductivity type into said SOI layer through a mask of a first resist film <51, 52> formed on said block region.

3. The method of manufacturing a semiconductor device according to claim 2, wherein
   said at least one element forming region includes a region for forming a transistor,
   said method further comprising:
   (e) a step executed in advance of said step (c) for forming a gate electrode <9> of said transistor on said at least one element forming region, said gate electrode being formed to extend on said isolation film,
   said step (c) including a step of introducing an impurity of said second conductivity type into said SOI layer through masks of said first resist film and said gate electrode.

4. The method of manufacturing a semiconductor device according to claim 3, wherein
   said first resist film and said gate electrode are continuously formed on a region reaching said at least one element forming region from said body region.

5. The method of manufacturing a semiconductor device according to claim 1, wherein
   said at least one element forming region includes a region for forming a transistor,
   said method further comprising:
   (e) a step executed in advance of said step (c) for forming a gate electrode <9> of said transistor on said at least one element forming region, said gate electrode being formed on part of said isolation film,
   said step (c) including a step of introducing an impurity of said second conductivity type into said SOI layer through masks of a first resist film formed on said body region and said gate electrode.

6. The method of manufacturing a semiconductor device according to claim 5, wherein
   said gate electrode is formed on a region reaching said at least one element forming region from said body region.

7. The method of manufacturing a semiconductor device according to claim 1, wherein
   said step (c) includes a step of introducing an impurity of said second conductivity type into said SOI layer through a mask of a first resist film <62> having a first opening on said active region, and
   said step (d) includes a step of introducing an impurity of said first conductivity type into said SOI layer through a mask of a second resist film <61, 63> having a second opening on said body region.

8. The method of manufacturing a semiconductor device according to claim 7, wherein
   said second opening includes an opening provided substantially only on said body region.

9. The method of manufacturing a semiconductor device according to claim 7, wherein
   said second opening includes an opening provided on said body region and part of said isolation film.

10. The method of manufacturing a semiconductor device according to claim 9, wherein
    said second opening includes an opening provided on a region reaching said at least one element forming region from said body region.

11. The method of manufacturing a semiconductor device according to claim 7, wherein
    said first resist film further has a first dummy opening <71> on a region other than said body region, said semiconductor region and said at least one element forming region, and
    said second resist film further has a second dummy opening <71> on a region other than said body region, said semiconductor region and said at least one element forming region.

12. The method of manufacturing a semiconductor device according to claim 11, wherein
    said first and second dummy openings are formed on the same position in the same shape.

13. The method of manufacturing a semiconductor device according to claim 11, wherein
    said first and second dummy openings are formed without overlapping with each other.

14. A method of manufacturing a semiconductor device comprising the steps of:
    (a) preparing an SOI substrate formed by a semiconductor substrate, insulating layer on said semicoductor substrate and a silicon layer on said insulating layer and said silicon layer has a first conductivity type in first, second and third regions;

(b) forming a partial oxide film with thickness not reaching to said insulating layer in a surface of said silicon layer in said layer in said second region between said first and third regions;

(c) forming a gate electrode through a gate oxide film on said surface of said silicon layer in said first region, said gate electrode extending on said partial oxide film in said second region;

(d) introducing a first impurity of a second conductivity type into both ends of said gate electrode in said first region using a first mask layer covering said third region and exposing said first region; and (e) introducing a second impurity of said first conductivity type into said third region using a second mask layer covering said first region and exposing said third region, wherein said first mask layer covers said third and second regions and a part of said gate electrode in said second region.

15. The method of manufacturing a semiconductor device according to claim 14, wherein said silicon layer includes a fourth region of said conductivity type different from said first, second and third regions, in said step (d), said first mask layer covers said fourth region, in saud step (e), said second mask layer exposes said fourth region, and said second impurity is introduced into said fourth region.

16. A method of manufacturing a semiconductor device comprising the steps of:

(a) preparing an SOI substrate formed by a semiconductor substrate, an insulating layer on said semiconductor substrate and a silicon layer on said insulating layer and said silicon layer has a first conductivity type in first, second and third regions;

(b) forming a partial oxide film with thickness not reaching to said insulating layer in a surface of said silicon layer in said second region between said first and third regions;

(c) forming a gate electrode through a gate oxide film on said surface of said silicon layer in said first region, said gate electrode extending on said partial oxide film in said second region;

(d) introducing a first impurity of a second conductivity type into both ends of said gate electrode in said first region using a first mask layer covering said third region and exposing said first region; and (e) introducing a second impurity of said first conductivity type into said third region using a second mask layer covering said first region and exposing said third region, wherein said first mask layer extends from said third region to said second region and covers a part of said gate electrode in said second region.

17. The method of manufacturing a semiconductor device according to claim 16, wherein said silicon layer includes a fourth region of said second conductivity type from said first, second and third regions, in said step (d), said first mask layer covers said fourth region, in said step (e), said second mask layer exposes said fourth region, and said second impurity is intorduced into said fourth region.

18. A method of manufacturing a semiconductor device comprising the steps of:

(a) preparing an SOI substrate formed by a semiconductor substrate, an insulating layer on said semiconductor substrate and a silicon layer on said insulating layer and said silicon layer has a first conductivity type in first, second and third regions;

(b) forming a partial oxide film with thickness not reaching to said insulating layer in a surface of said silicon layer in said second region between said first and third regions;

(c) forming a gate electrode throught a gate oxide film on said surface of said silicon layer in said first region, said gate electrode extending on said partial oxide film in said second region;

(d) introducing a first impurity of a second conductivity type into both ends of said gate electrode in said first region using a first mask layer covering said third region and exposing said first region; and (e) introducing a second inpurity of said first conductivity type into said third region using a second mask layer covering said first region and exposing said third region, wherein said first mask layer covers said partial oxide film and a part of said gate electrode in said second region.

19. The method of manufacturing a semiconductor device according to claim 18, wherein said silicon layer includes a fourth region of said second conductivity type different from said first, second and third regions, in said step (d), said first mask layers covers and fourth region, in said step (e), said second mask layer exposes said fourth region, and in said step (f), said impurity is introduced into said fourth region.

* * * * *